US008830097B2

(12) United States Patent
Aruga et al.

(10) Patent No.: US 8,830,097 B2
(45) Date of Patent: Sep. 9, 2014

(54) A/D CONVERTER

(75) Inventors: Kenta Aruga, Kunitachi (JP); Takashi Miyazaki, Akiruno (JP); Hiroyuki Tomura, Akiruno (JP)

(73) Assignee: Spansion LLC, Sunnyvale, CA (US)

(*) Notice: Subject to any disclaimer, the term of this patent is extended or adjusted under 35 U.S.C. 154(b) by 0 days.

(21) Appl. No.: 13/558,093

(22) Filed: Jul. 25, 2012

(65) Prior Publication Data
US 2013/0057421 A1  Mar. 7, 2013

(30) Foreign Application Priority Data
Sep. 2, 2011  (JP) .................................. 2011-191481

(51) Int. Cl.
H03M 3/00 (2006.01)
H03M 3/02 (2006.01)

(52) U.S. Cl.
CPC ........................................ *H03M 3/02* (2013.01)
USPC ............ 341/143; 341/122; 341/155; 341/172

(58) Field of Classification Search
USPC ......................................... 341/143, 172, 155
See application file for complete search history.

(56) References Cited

U.S. PATENT DOCUMENTS

| | | | |
|---|---|---|---|
| 4,851,841 A | 7/1989 | Sooch | |
| 4,939,516 A | 7/1990 | Early | |
| 4,972,436 A | 11/1990 | Halim et al. | |
| 5,659,314 A | 8/1997 | Tokura et al. | |
| 5,844,514 A | 12/1998 | Ringh et al. | |
| 6,452,521 B1 * | 9/2002 | Wang et al. | 341/139 |
| 6,653,967 B2 * | 11/2003 | Hamashita | 341/172 |
| 6,768,436 B1 | 7/2004 | Chuang | |
| 7,190,291 B2 * | 3/2007 | Markowski et al. | 341/122 |
| 7,286,074 B2 * | 10/2007 | Kudoh et al. | 341/162 |
| 7,504,977 B2 * | 3/2009 | Doorenbos et al. | 341/143 |
| 7,535,398 B2 * | 5/2009 | Lim et al. | 341/155 |
| 7,679,422 B1 * | 3/2010 | Thiagarajan et al. | 327/337 |

(Continued)

FOREIGN PATENT DOCUMENTS

| JP | 8-125541 A | 5/1996 |
|---|---|---|
| JP | 10-508167 A | 8/1998 |

(Continued)

OTHER PUBLICATIONS

Bernhard E. Boser et al., "The Design of Sigma-Delta Modulation Analog-to-Digital Converters", IEEE Journal of Solid-State Circuits, Dec. 1998, vol. 23, No. 6, pp. 1298-1308.

(Continued)

*Primary Examiner* — Linh Nguyen
(74) *Attorney, Agent, or Firm* — Sterne, Kessler, Goldstein & Fox P.L.L.C.

(57) ABSTRACT

An arithmetic operation circuit provided in a delta-sigma modulator of a delta-sigma A/D converter includes two reference capacitors which are respectively provided at a positive side input node and a negative side input node of an operational amplifier. When a signal corresponding to an output of the modulator is added or subtracted to or from an input signal, the amount of charge added to the input node of the operational amplifier is made to be always the same regardless of the reference voltage by complementarily switching the connection of the reference capacitors at the positive side input node and the negative side input node, and thereby the potential of the input node of the operational amplifier is made to converge to the common mode potential of the circuit.

27 Claims, 10 Drawing Sheets

(56) References Cited

U.S. PATENT DOCUMENTS

| | | | |
|---|---|---|---|
| 7,994,958 B2* | 8/2011 | Quiquempoix et al. | 341/150 |
| 8,624,767 B2* | 1/2014 | Schmid et al. | 341/143 |
| 2001/0033240 A1 | 10/2001 | Ueno et al. | |
| 2002/0149508 A1 | 10/2002 | Hamashita | |
| 2010/0019944 A1* | 1/2010 | Oliaei et al. | 341/143 |
| 2012/0161994 A1* | 6/2012 | Quiquempoix et al. | 341/143 |
| 2013/0050003 A1* | 2/2013 | Wang | 341/143 |

FOREIGN PATENT DOCUMENTS

| | | |
|---|---|---|
| JP | 2001-358591 A | 12/2001 |
| JP | 2002-261614 A | 9/2002 |
| JP | 2006-041992 A | 2/2006 |
| JP | 2007-300225 A | 11/2007 |

OTHER PUBLICATIONS

Brian P. Brandt et al., "Second-Order Sigma-Delta Modulation for Digital-Audio Signal Acquisition", IEEE Journal of Solid-State Circuits, Apr. 1991, vol. 26, No. 4, pp. 618-627.

Max W. Hauser et al., "MOS ADC-Filter Combination That Does Not Require Precision Analog Components", IEEE International Solid-State Circuits Conference, 1985, Digest of Technical Papers, pp. 80-82.

Akira Yukawa, "Oversampling A-D Conversion Technology" (partial translation), 1990.

Richard Schreier et al., "Introduction to Delta-Sigma Type Analog/Digital Converter", (partial translation), 2007.

* cited by examiner

F I G. 1
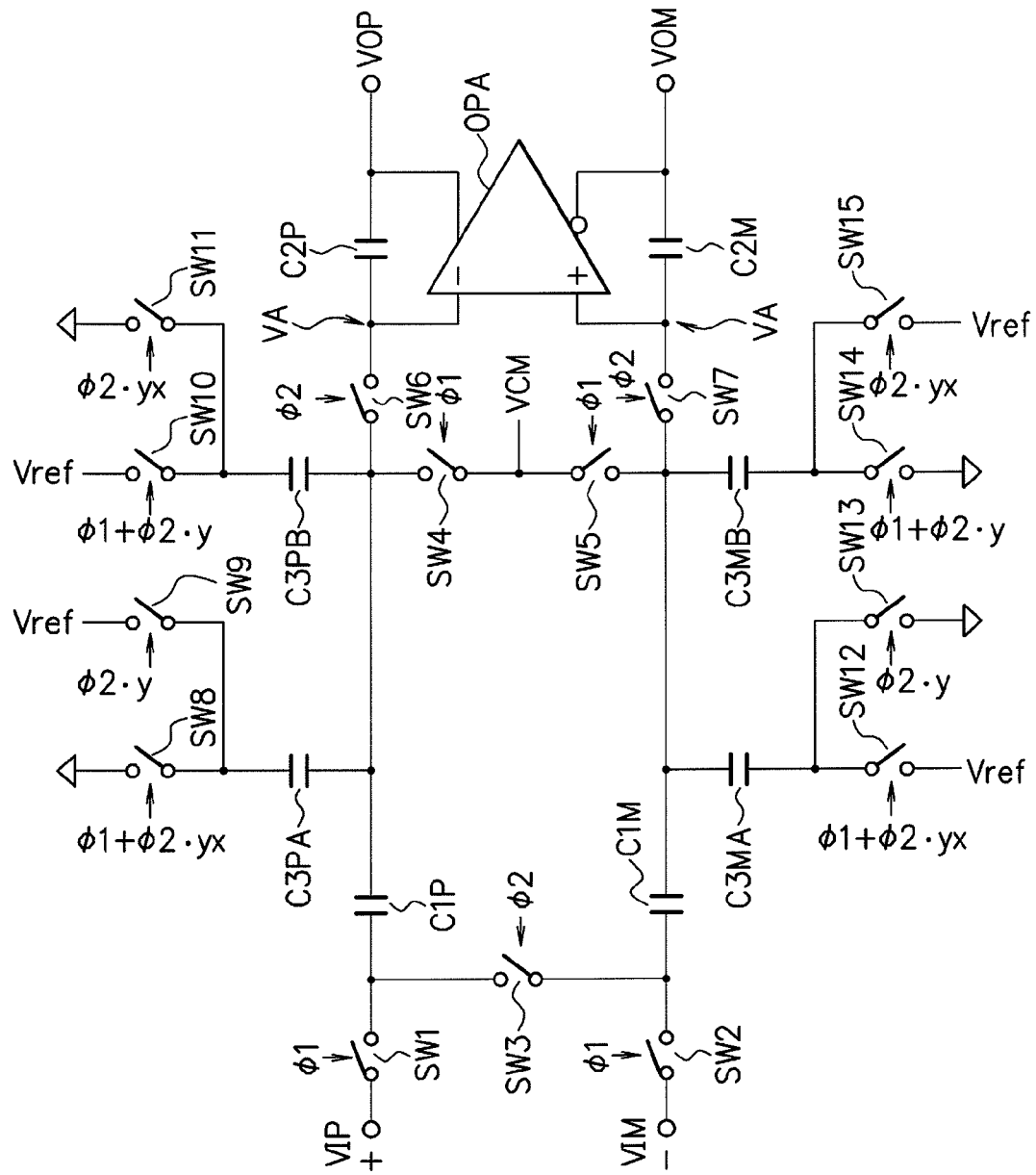

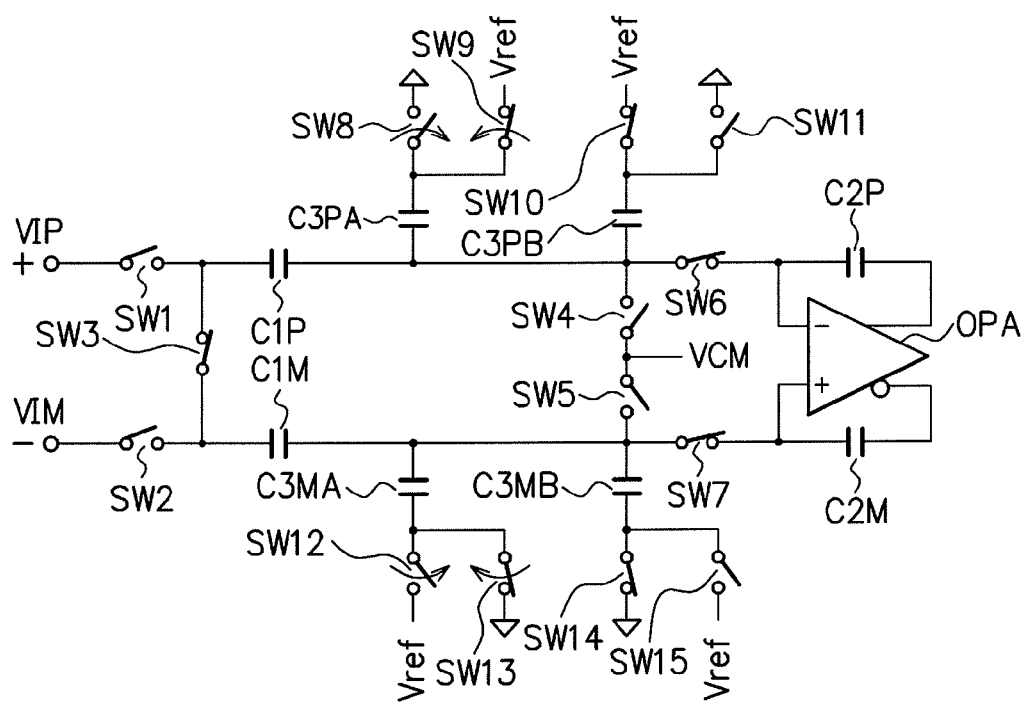
F I G. 2C

F I G. 3
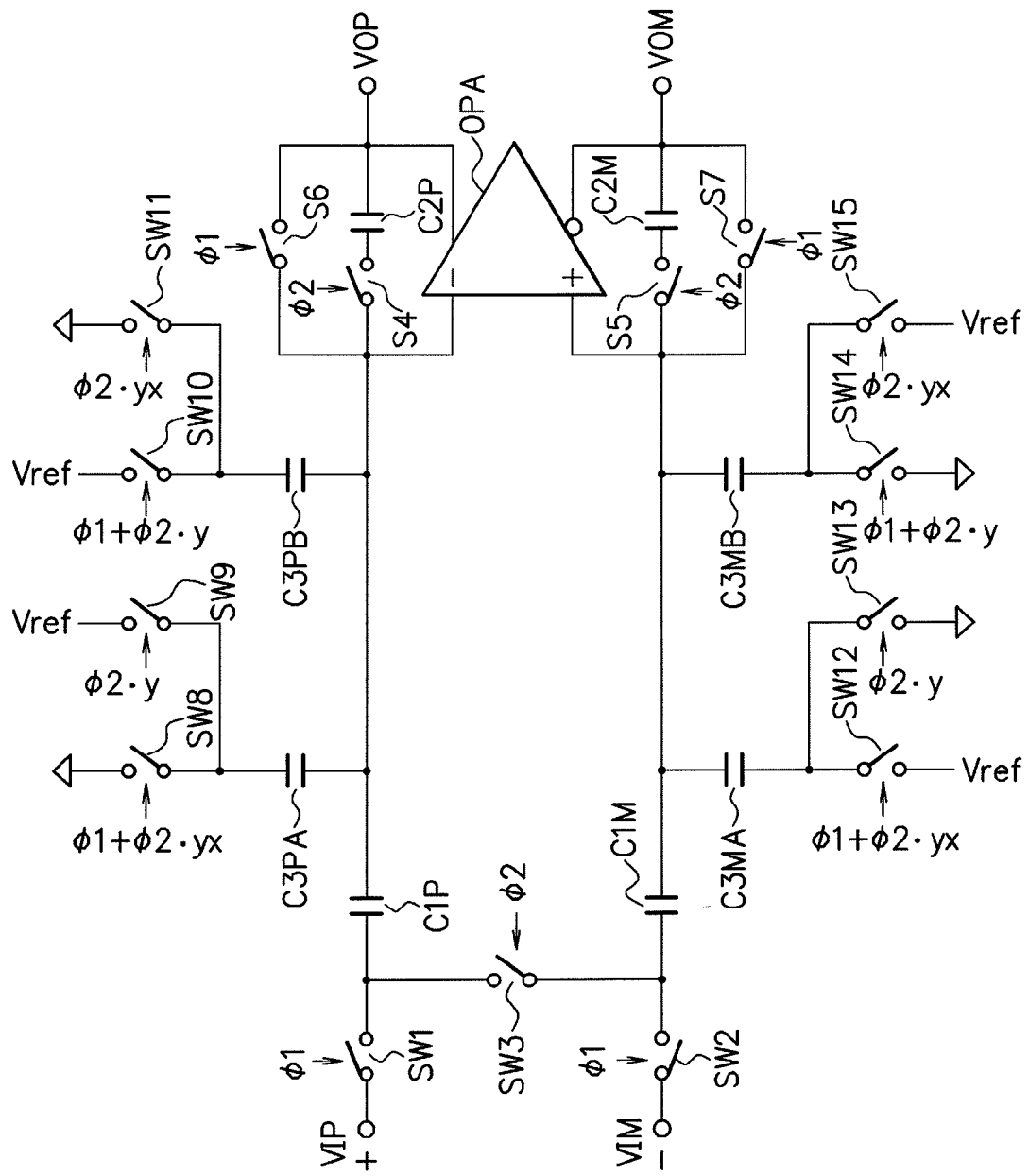

F I G. 5
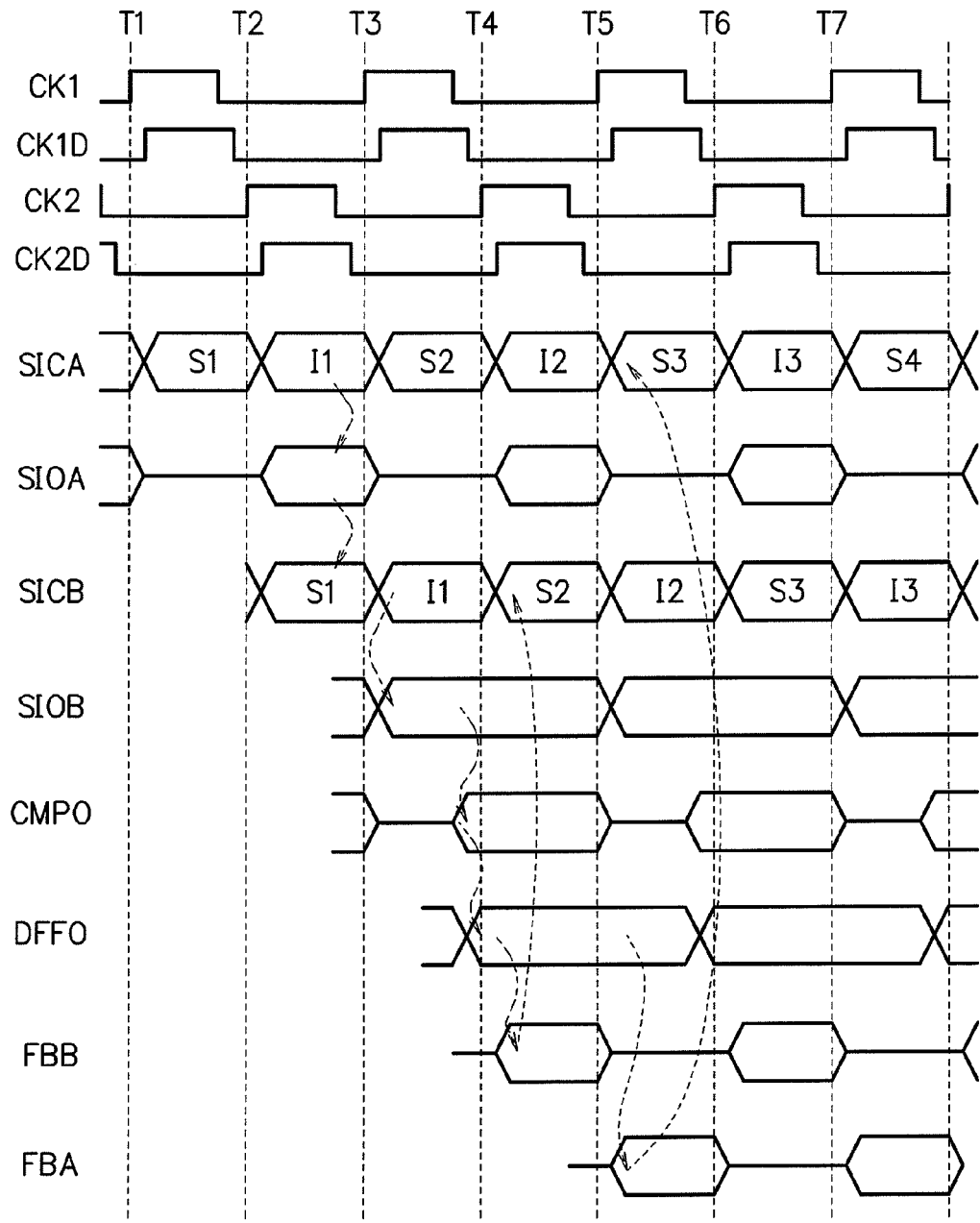

F I G. 9A
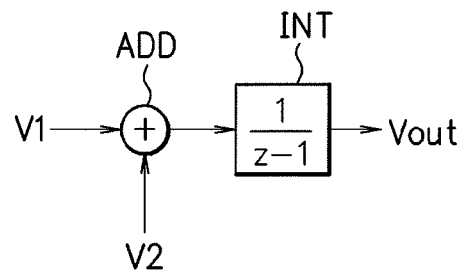
F I G. 9B
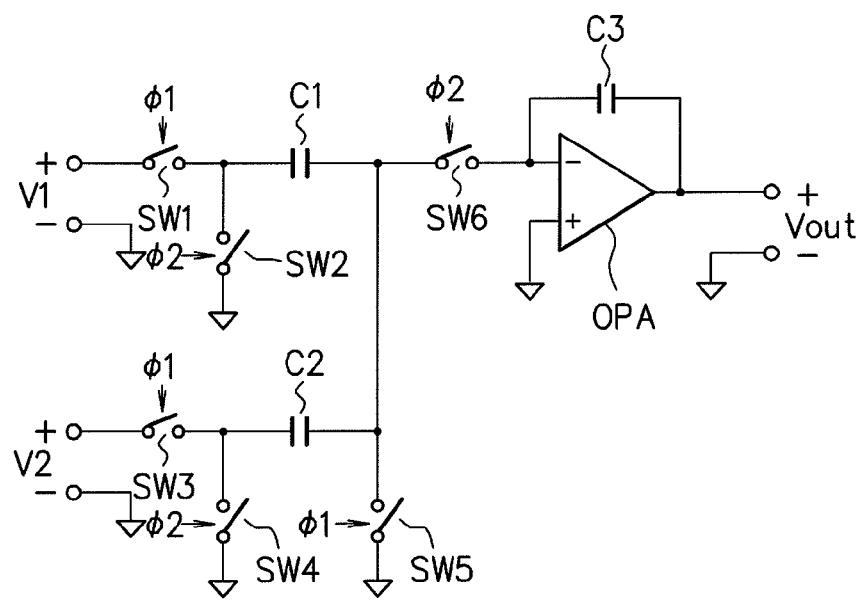
F I G. 10
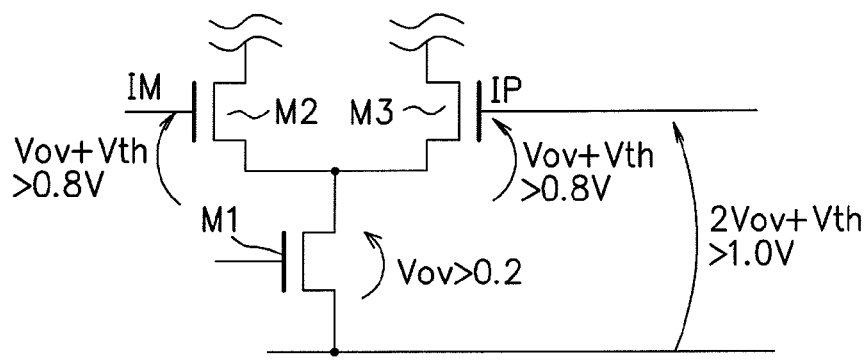

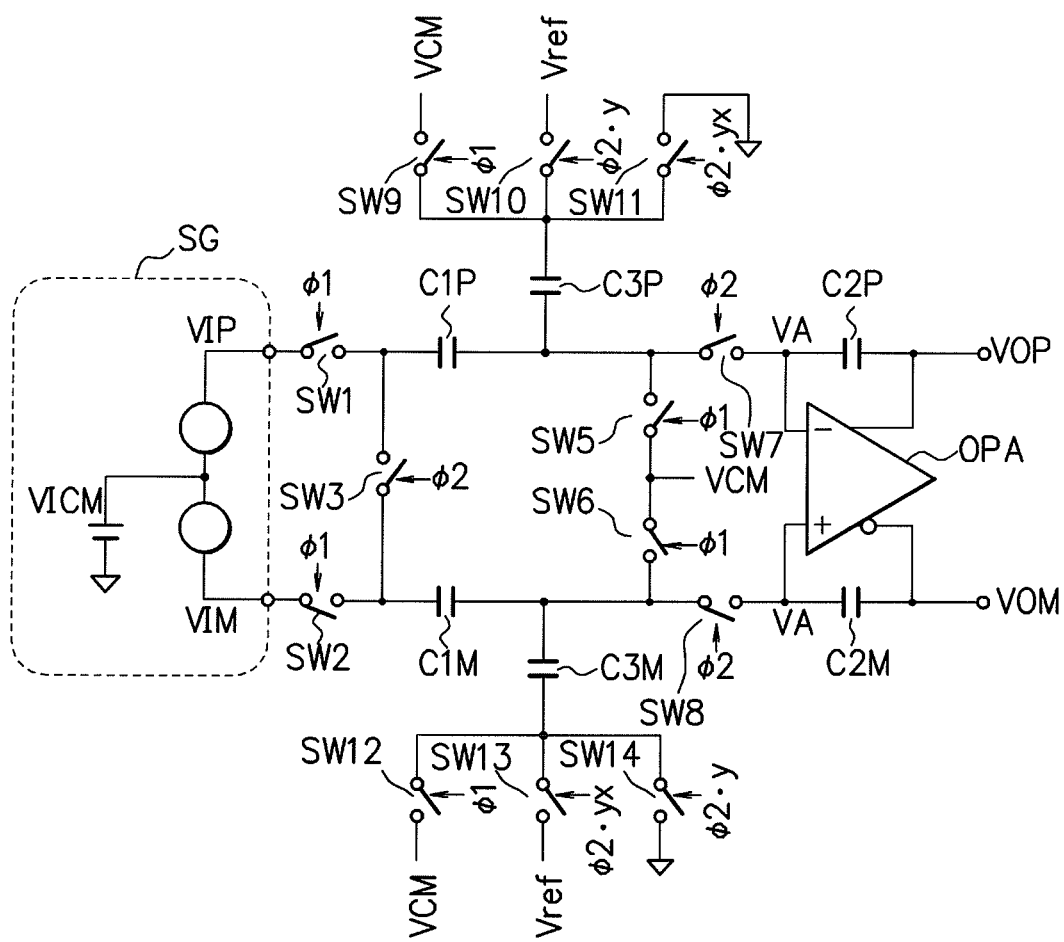
F I G. 13

A/D CONVERTER

CROSS-REFERENCE TO RELATED APPLICATION

This application is based upon and claims the benefit of priority of the prior Japanese Patent Application No. 2011-191481, filed on Sep. 2, 2011, the entire contents of which are incorporated herein by reference.

FIELD

The embodiments discussed herein are related to a delta-sigma type A/D converter (analog/digital converter).

BACKGROUND

A delta-sigma type analog/digital converter (delta-sigma A/D converter) is an A/D converter based on an oversampling technique, and is used for digitizing a relatively low speed signal, such as an audio signal and a sensor signal. The delta-sigma A/D converter has an excellent monotonously increasing characteristic, and can attain high resolution, such as 16 bits, by a comparatively simple circuit. The delta-sigma A/D converter is used, for example, as an A/D converter incorporated in a micro controller unit (MCU).

The delta-sigma A/D converter includes a delta-sigma modulator which performs delta-sigma modulation of an input analog signal, and a decimation filter which generates an A/D conversion result from the delta-sigma modulated signal. FIG. 6 is a view illustrating a configuration example of a delta-sigma A/D converter including a 1-bit delta-sigma modulator. In FIG. 6, reference character MOD denotes the delta-sigma modulator, and reference character FLT denotes the decimation filter. The delta-sigma modulator MOD delta-sigma modulates an input analog signal Vin at a frequency (oversampling frequency) of several ten to several hundred times the signal frequency of the input analog signal Vin, and outputs a 1-bit delta-sigma modulated signal D1. The 1-bit delta-sigma modulated signal D1 is a pulse density modulated signal. When the input analog signal Vin is large, the number of bits "1" included in the pulse density modulated signal is increased, and when the input analog signal Vin is small, the number of bits "0" included in the pulse density modulated signal is increased. The decimation filter FLT extracts signal band components from the 1-bit delta-sigma modulated signal D1 generated by the delta-sigma modulator MOD and expands the extracted signal band components to a desired bit width. Further, the decimation filter FLT downsamples the expanded signal band components at a low data rate, and outputs the results of the down sampling as an A/D conversion result. The A/D conversion result is outputted as digital codes corresponding to the magnitude of the input analog signal Vin. In the example illustrated in FIG. 6, a 16-bit digital output D2 is outputted as the A/D conversion result of the A/D converter.

FIG. 7 is a view illustrating an example of signal paths for realizing a delta-sigma modulator provided in a delta-sigma A/D converter (see Non-Patent Document 3: FIG. 1, and Non-Patent Document 4: FIG. 1). In the delta-sigma modulator, there are various variations in the bit width of the output code, the order of the noise transfer function, the structure of signal paths, and the like, but, here, signal paths for realizing a 1-bit second-order delta-sigma modulator are illustrated as an example. In FIG. 7, each of reference characters AD1, AD2, AD3 and AD4 denotes an adder which adds two inputted signals and outputs the added result. In FIG. 7, the adder, to which a "−" (minus sign) is attached, means an adder which adds an input after reversing the sign of the input. Further, each of reference characters DL1, DL2, DL3 and DL4 denotes a delay device which delays an inputted signal by one cycle and outputs the delayed signal. Reference character AM1 denotes an amplifier which doubles an inputted signal and outputs the doubled signal, and reference character Q1 denotes a quantizer which quantizes an inputted signal. In many cases, the delta-sigma modulator is configured by a switched capacitor circuit, or the like, and performs arithmetic operation at discrete times, and hence, here, the time relation between the cycles is illustrated by using the delay devices.

In FIG. 7, the adder AD1 subtracts an output delta-sigma modulated signal V from an input analog signal U, and outputs the subtracted result as a signal S3. The adder AD2 adds the signal S3 to an output of the adder AD2 itself, which output is delayed for one cycle by the delay device DL1, and the adder AD2 outputs the added results as a signal S4. That is, the pair of the adder AD2 and the delay device DL1 functions as an integrator which integrates the signal S3 over time. The adder AD3 subtracts a signal S7 (doubled output delta-sigma modulated signal V) outputted from the amplifier AM1 from a signal S1 that is an output of the adder AD2, which output is delayed for one cycle by the delay device DL2, and the adder AD3 outputs the subtracted result as a signal S5. The adder AD4 adds the signal S5 to an output of the adder AD4 itself, which output is delayed for one cycle by the delay device DL3, and the adder AD4 outputs the added results as a signal S6. That is, the pair of the adder AD4 and the delay device DL3 functions as an integrator which integrates the signal S5 over time. The quantizer Q1 quantizes a signal S2 that is an output of the adder AD4, which output is delayed for one cycle by the delay device DL4, and the quantizer Q1 outputs the output delta-sigma modulated signal V of "1" or "−1". The quantizer Q1 outputs "1" in the case where the inputted signal S2>0, and outputs "−1" in the case where the inputted signal S2<0. That is, the output delta-sigma modulated signal V, which is the output of the quantizer Q1, is a binary (1 bit) signal.

In the delta-sigma modulator having the signal paths illustrated in FIG. 7, the output delta-sigma modulated signal V is negative-fed back through the adders AD1 and AD3 in a duplicated manner. For this reason, when the signal S2 is increased, the output delta-sigma modulated signal V becomes "1", so that the signal S7 becomes "2". Thereby, the adder AD3 operates to reduce the signals S5 and S6, so that the signal S2 is reduced. Further, when the signal S1 is increased, the adder AD3 operates to increase the signals S5, S6 and S2, so that the output delta-sigma modulated signal V becomes "1". When the output delta-sigma modulated signal V becomes "1", the adder AD1 operates to reduce the signal S3, and also the adder AD3 operates to reduce the signal S5. As a result, the signals S1 and S2 are reduced. It is known that, with such negative feedback, the divergence does not occur in the signal paths illustrated in FIG. 7 in the region in which the input analog signal U is not excessive. For example, by the use of the arithmetic operation circuit having the signal paths as illustrated in FIG. 7, the delta-sigma modulator MOD illustrated in FIG. 6 can be realized.

FIG. 8 is a view in which the signal paths of the 1-bit second-order delta-sigma modulator illustrated in FIG. 7 is illustrated by using z operators. In FIG. 8, reference characters AD1 and AD2 respectively denote adders, and reference characters INT1 and INT2 respectively denote integrators. Reference character AM1 denotes an amplifier in which the inputted signal is amplified to be doubled, and reference character Q1 denotes a quantizer which quantizes the inputted signal. Reference character U1 denotes an arithmetic operation block configured by the adder AD1 and the integrator INT1. As illustrated in FIG. 8, the arithmetic operation unit configured by the adder AD2 and the delay devices DL1 and DL2 in FIG. 7 can be expressed as the integrator INT1, and the arithmetic operation unit configured by the adder AD4 and the delay devices DL3 and DL4 in FIG. 7 can be expressed as the integrator INT2. Further, the quantizer Q1 binarizes the inputted signal by determining the magnitude of the inputted signal, but this arithmetic operation performed by the quantizer Q1 can be modeled by adding quantization noise to the inputted signal. Accordingly, in FIG. 8, the quantizer Q1 is illustrated as a block which outputs a signal formed by adding quantization noise E to the signal S2.

When the signal paths illustrated in FIG. 7 are expressed and arranged by using the z operator as illustrated in FIG. 8, a noise transfer function NTF (z) from the quantization noise E to the output V, and a signal transfer function STF (z) from the input U to the output V are expressed as follows.

$$NTF(z)=(1-z^{-1})^2$$

$$STF(z)=z^{-2}$$

These expressions indicate that the input U appears in the output V as it is, and that the quantization noise E is diffused into the high frequency range and outputted. In the delta-sigma A/D converter, a decimation filter is provided in the subsequent stage of the delta-sigma modulator as described above, and thereby an A/D conversion result is obtained by eliminating the quantization noise diffused into the high frequency range.

Next, there will be described a circuit configuration in which the signal paths for realizing the delta-sigma modulator described above are formed on a semiconductor integrated circuit. Each of FIG. 9A and FIG. 9B is a view illustrating an example of an arithmetic operation (addition and integration) circuit having a single-end structure (see Patent Document 1: FIG. 1, Patent Document 3: FIG. 3 and FIG. 6, Patent Document 4: FIG. 6). An example of the circuit configuration which realizes the functions of the arithmetic operation block illustrated in FIG. 9A is illustrated in FIG. 9B. That is, as illustrated in FIG. 9A, the arithmetic operation circuit illustrated in FIG. 9B realizes an arithmetic operation block configured by an adder ADD which adds input signals (input voltages) V1 and V2, and an integrator INT which integrates the addition result from the adder ADD and outputs the integration result as an output signal (output voltage) Vout.

In FIG. 9B, reference characters C1 and C2 respectively denote sampling capacitors, and reference character C3 denotes an integration capacitor. Reference character OPA denotes an operational amplifier. Reference characters SW1, SW2, SW3, SW4, SW5 and SW6 respectively denotes switches. Conduction/non-conduction (on/off) of each of the switches SW1, SW3 and SW5 is controlled by a signal φ1. Conduction/non-conduction (on/off) of each of the switches SW2, SW4 and SW6 is controlled by a signal φ2. The capacitors C1, C2 and C3 are assumed to have the capacitance values C1, C2 and C3, respectively. In the capacitors C1 and C2, the left side node (electrode on the side of the switches SW1 and SW3) is referred to as a bottom plate, and the right side node (electrode on the side of the switch SW6) is referred to as a top plate.

In the circuit illustrated in FIG. 9B, the signals φ1 and φ2 are controlled on the basis of a clock signal, or the like, and the addition of the input signals V1 and V2, and the integration of the addition result are performed by alternately turning on either the group of the switches SW1, SW3 and SW5, or the group of switches SW2, SW4 and SW6.

First, when the switches SW1, SW3 and SW5 are turned on by the signal φ1, and when the switches SW2, SW4 and SW6 are turned off by the signal φ2, the voltage V1 is applied to the bottom plate of the capacitor C1, and the voltage V2 is applied to the bottom plate of the capacitor C2. The top plates of the capacitors C1 and C2 are connected to 0 (V). The electric charges Q1 and Q2 which are respectively stored in the capacitors C1 and C2 at this time are expressed as follows.

$$Q1=-C1 \cdot V1$$

$$Q2=-C2 \cdot V2$$

Thereby, the electric charges corresponding to the input voltages V1 and V2 are sampled by the capacitors C1 and C2, respectively. Further, when the voltage value of the output voltage Vout at this time is assumed to be Vout1, the electric charges Q3 stored in the capacitor C3 is expressed as follows.

$$Q3=-C3 \cdot Vout1$$

Next, when the switches SW1, SW3 and SW5 are turned off by the signal φ1, and when the switches SW2, SW4 and SW6 are turned on by the signal φ2, the bottom plates of the capacitors C1 and C2 are connected to 0 (V), and the top plates of the capacitors C1 and C2 are connected to the negative side input terminal of the operational amplifier OPA. As a result, the circuit operates so that the electric charges stored in the capacitors C1 and C2 are transferred to the capacitor C3 by the operation of the operational amplifier OPA, and thereby the voltage value of the output voltage Vout is changed from Vout1 to Vout2. At this time, the charge conservation law is established as follows.

$$-C3 \cdot Vout2=Q1+Q2+Q3$$

Therefore, the voltage value Vout2 is expressed as follows.

$$Vout2=Vout1+(C1/C3)V1+(C2/C3)V2$$

That is, by a series of the operations, the voltage obtained by adding the (C1/C3) V1 and (C2/C3) V2 to the Vout1 is outputted as the output voltage Vout. Thereafter, the above-described operations are repeatedly performed in such a manner that the switches SW1, SW3 and SW5 are turned on by the signal φ1, and that the switches SW2, SW4 and SW6 are turned off by the signal φ2. Thereby, the arithmetic operation for adding the input signals V1 and V2, and for integrating the addition result is realized.

The above-described operation is expressed by the z operators as follows.

$$Vout(z)=[(C1/C3)V1(z)+(C2/C3)V2(z)]/(z-1)$$

In the arithmetic operation circuit illustrated in FIG. 9B, the arithmetic operation is performed in such a manner that the input signal (input voltage) V1 is scaled by (C1/C3) times, and that the input signal (input voltage) V2 is scaled by (C2/C3) times. The ratios of (C1/C3) and (C2/C3) are suitably changed according to the purpose of preventing the saturation of the signals in the circuit, the convenience of the design of the signal paths, and the like.

FIG. 10 is a view illustrating a circuit configuration of the input portion of the operational amplifier (see Non-Patent Document 5: FIG. 2). In FIG. 10, reference characters N1, M2 and M3 denote N-type MOS transistors, respectively. The MOS transistor M1 has a role of biasing the MOS transistors M2 and M3. The MOS transistors M2 and M3 form a pair of transistors whose source are connected to each other. The gate of the MOS transistor M2 corresponds to the positive side input node (positive side input terminal) IM of the operational amplifier, and the gate of the MOS transistor M3 corresponds to the negative side input node (negative side input terminal) IP of the operational amplifier.

The differential pair illustrated in FIG. 10 is normally operated, when the gate-source voltage of each of the MOS transistors M2 and M3 is lager than a voltage obtained by adding an overdrive voltage Vov of about 0.2 (V) to the threshold voltage Vth of the transistor. For example, when the threshold voltage of the transistor is assumed to be 0.6 (V), each of the MOS transistors M2 and M3 may be biased so that the gate-source voltage becomes 0.8 (V) (=0.2 (V)+0.6 (V)) or more. In order to enable the circuit to normally operate, the drain-source voltage of the MOS transistor M1 may be set to, for example, 0.2 (V) or more.

Because of the restrictions to enable each of the MOS transistors to normally operate, a potential of 1.0 (V) (=0.2 (V)+0.8 (V)) or more may be applied to each of the input terminals IM and IP in order to enable the operational amplifiers to normally operate. For example, when the power supply voltage is 3.0 (V), the operational amplifier does not operate as expected unless the potential of each of the input terminals IM and IP is in the range of 1.0 (V) to 3.0 (V). In this way, the operational amplifier does not operate unless the potential of each of the input terminals IM and IP is actually set at a high potential to some extent. For this reason, even in the operational amplifier included in the delta-sigma A/D converter, the voltage applied to the input terminal of the operational amplifier may be in the suitable range. The voltage range of the input terminal of the operational amplifier, which voltage range is suitable for the normal operation of the operational amplifier, is referred to as a common mode input voltage range.

The arithmetic operation circuit illustrated in FIG. 9B has a single-end structure. However, in an actual semiconductor integrated circuit, the arithmetic operation circuit is formed in a differential structure in many cases because of such advantages as that, as compared with the single-end structure, the differential structure can be used for a signal having large amplitude and is hardly influenced by common mode noise. In the following, there will be described examples of an arithmetic operation circuit having a differential structure and used in a delta-sigma A/D converter.

FIG. 11 is a view illustrating an example of a circuit configuration of a switched capacitor integrator having a differential structure (see Patent Document 2: FIG. 7, Patent Document 6: FIG. 7). In FIG. 11, reference characters C1P and C1M respectively denote sampling capacitors, and reference characters C2P and C2M respectively denote integration capacitors. Reference character OPA denotes a fully differential operational amplifier. Reference characters SW1, SW2, SW3, SW4, SW5, SW6, SW7 and SW8 respectively denote switches. Conduction/non-conduction (on/off) of each of the switches SW1, SW2, SW5 and SW6 is controlled by a signal φ1. Conduction/non-conduction (on/off) of each of the switches SW3, SW4, SW7 and SW8 is controlled by a signal φ2. Reference character VIP denotes a positive side input node and reference character VIM denotes a negative side input node. Reference character VOP denotes a positive side output node, and reference character VOM denotes a negative side output node. Note that, in the following, the name of a signal inputted or outputted to or from each node, and the voltage value of the each node are also suitably represented by using the same reference character as the reference character given to the node. Reference character SG denotes a signal source which outputs a differential input signal (VIP−VIM). The signal source SG is provided outside a semiconductor integrated circuit (IC) in which the switched capacitor integrator having the differential structure is formed.

The arithmetic operation circuit (switched capacitor integrator) illustrated in FIG. 11 has functions of integrating the differential input signal (VIP−VIM) supplied from the signal source SG, and of outputting the integration result as a differential output signal (VOP−VOM). In the arithmetic operation circuit illustrated in FIG. 11, the operational amplifier OPA performs the common mode feedback by referring to a common mode potential VCM so that the common potential of the output signals VOP and VOM becomes VCM, that is, is expressed as (VOP+VOM)/2=VCM. Note that, in FIG. 11, the common mode potential VCM is assumed to be an intermediate potential between a power supply voltage VDD and a ground voltage VSS (0 (V)). Reference character VICM denotes an intermediate potential between the input signals VIP and VIM, that is, a common mode potential of the input signal. The capacitance values of C1P and C1M are set to be the same capacitance value of C1, and the capacitance values of C2P and C2M are set to be the same capacitance value of C2.

In the arithmetic operation circuit illustrated in FIG. 11, first, when the switches SW1, SW2, SW5 and SW6 are turned on by the signal φ1, and when the switches SW3, SW4, SW7 and SW8 are turned off by the signal φ2, the voltages VIP and VIM are applied to the bottom plates of the capacitors C1P and C1M, respectively. The top plates of the capacitors C1P and C1M are connected to the common mode potential VCM. The charges Q1P and Q1M respectively stored in the capacitors C1P and C1M at this time are expressed as follows.

$$Q1P=(VCM-VIP)C1$$

$$Q1M=(VCM-VIM)C1$$

The charge corresponding to the difference between the common mode potential VCM and the input voltage VIP is sampled by the capacitor C1P. The charge corresponding to the difference between the common mode potential VCM and the input voltage VIM is sampled by the capacitor C1M. Further, at this time, when it is assumed that the voltage value of the output signal VOP is VOP1, and that the voltage value of the output signal VOM is VOM1, the sum of the charges stored in the capacitors C2P and C2M is expressed as follows.

$$(VOP1-VCM)C2+(VCM-VOM1)C2=(VOP1-VOM1)C2$$

Next, when the switches SW1, SW2, SW5 and SW6 are turned off by the signal φ1, and when the switches SW3, SW4, SW7 and SW8 are turn on by signal φ2, the bottom plates of the capacitors C1P and C1M are connected to the common mode potential VCM. The top plate of the capacitor C1P is connected to the negative side input terminal of the operational amplifier OPA, and the top plate of the capacitor C1M is connected to the positive side input terminal of the operational amplifier OPA. As a result, by the operation of the operational amplifier OPA, the voltage value of the output signal VOP is changed to VOP2, and the voltage value of the output signal VOM is changed to VOM2. At this time, when the charges in the previous state are assumed to be conserved, the following expression is established.

$$(VOP2-VOM2)C2=(VOP1-VOM1)C2+Q1P-Q1M$$

Therefore, the following expression is established.

$$(VOP2-VOM2)=(VOP1-VOM1)+(VIP-VIM)C1/C2$$

That is, the differential output voltage expressed as (VOP2−VOM2) becomes the sum of the differential output voltage of one previous operation, which voltage is expressed as (VOP1−VOM1), and the product of the differential input voltage with the capacitance ratio, which product is expressed as (VIP−VIM) (C1/C2). This is corresponds to one integration operation.

Here, the common mode potential VCM of the differential signal in the semiconductor integrated circuit is a potential determined according to the power supply voltage of the semiconductor integrated circuit. The common mode potential VICM of the input signal is a potential determined according to the signal source SG outside the semiconductor integrated circuit. Therefore, the common mode potential VCM and the common mode potential VICM are not directly related to each other. Generally, in a differential input A/D converter, two input terminals for inputting the differential input signals (VIP and VIM) are provided, but the input terminal for inputting the common mode potential VICM of the input signal is not provided. It is preferred that the arithmetic operation of a differential signal is normally performed by the circuit regardless of the relationship between the common mode potential VCM and the common mode potential VICM of the input signal.

However, in the arithmetic operation circuit illustrated in FIG. 11, when the common mode potential VCM and the common mode potential VICM of the input signal are significantly different from each other, there arises a problem that the potential of the node VA deviates from the suitable input voltage range of the operational amplifier OPA, so as to prevent the operation of the integrator. This is because the potential of the node VA is determined by the charges sampled in the capacitors C1P and C1M during the φ1-period and by the capacitive division circuit configured by the operation of the switches during the φ2-period. Note that the φ1-period is the period in which the switches controlled by the signal φ1 is turned on, that is, the period in which the switches SW1, SW2, SW5 and SW6 are turned on, and in which the switches SW3, SW4, SW7 and SW8 are turned off. Further, the φ2-period is the period in which the switches controlled by the signal φ2 is turned on, that is, the period in which the switches SW1, SW2, SW5 and SW6 are turned off, and in which the switches SW3, SW4, SW7 and SW8 are turned on.

In the arithmetic operation circuit illustrated in FIG. 11, the amount of charges sampled by the capacitors C1P and C1M in the φ1-period is held as it is during the φ2-period, and hence the following expression is established.

$$(VCM-VIP)C1+(VCM-VIM)C1=2(VA-VCM)C1$$

The above expression is rearranged with VA, so that the following expression is obtained.

$$VA=2VCM-(VIP+VIM)/2=2VCM-VICM$$

That is, the potential of the input node VA of the operational amplifier OPA is converged to the potential obtained by subtracting VICM from 2VCM. For example, when the common mode potential VCM is 1.5 (V), and when the common mode potential VICM of the input signal is 2.5 (V), the potential of the input node VA of the operational amplifier OPA is converged to 0.5 (V). However, as described above, there is a restriction in the range of the common mode input voltage of the operational amplifier OPA. For example, when the potential of the input nodes IM and IP of the operational amplifier is 0.5 (V) in the circuit illustrated in FIG. 10, the differential pair is cut off, so that the desired operation is not performed. When the circuit configuration in the operational amplifier OPA of the arithmetic operation circuit illustrated in FIG. 11 is assumed to be the same as the circuit configuration illustrated in FIG. 10, the common mode potential VICM of the input signal is set in a voltage range of 0 (V)<VICM<2.0 (V) in order to enable the operational amplifier OPA to normally operate.

The existence of this restriction becomes a problem in particular when a single end signal is A/D converted by using a differential input A/D converter. For example, when a single end signal is A/D converted by a differential input A/D converter, one side of the two input terminals is set to a fixed potential. However, in the A/D converter using the arithmetic operation circuit illustrated in FIG. 11, for example, in the case where the negative side input terminal VIM is set to 1.5 (V), and where the positive side input terminal VIP is connected to the signal source, when a signal of 2.5 (V) or more is applied from the signal source, the common mode potential VICM of the input signal becomes larger than 2.0 (V), so as to prevent the operation of the circuit. In this way, in the case where the arithmetic operation circuit illustrated in FIG. 11 is used for a delta-sigma A/D converter, there is a problem that the user's design of the signal source is greatly restricted.

As a circuit configuration which eliminates the above-described problem in the arithmetic operation circuit illustrated in FIG. 11, an arithmetic operation circuit illustrated in FIG. 12 is proposed (see Patent Document 7: FIG. 4). FIG. 12 is a view illustrating another example of a circuit configuration of a switched capacitor integrator having a differential structure. In FIG. 12, components having the same functions as the functions of the components illustrated in FIG. 11 are denoted by the same reference characters, and the duplicated explanation thereof is omitted. The arithmetic operation circuit illustrated in FIG. 12 is provided with capacitive elements C3P and C3M which are not provided in the arithmetic operation circuit illustrated in FIG. 11. Each of the capacitive elements C3P and C3M may be formed by parasitic capacitance and hence is illustrated by a broken line. Further, the arithmetic operation circuit illustrated in FIG. 11 is configured such that the bottom plate of the capacitor C1P can be connected to the common mode potential VCM via the switch SW3, and such that the bottom plate of the capacitor C1M can be connected to the common mode potential VCM via the switch SW4. On the other hand, in the arithmetic operation circuit illustrated in FIG. 12, the bottom plates of the capacitors C1P and C1M are configured to be mutually connectable via the switch SW3.

In the arithmetic operation circuit illustrated in FIG. 12, in the φ1-period, the bottom plates of the capacitive elements C3P and C3M are connected to 0 (V), and the top plates of the capacitive elements C3P and C3M are connected to the common mode potential VCM. The voltages VIP and VIM are respectively applied to the bottom plates of the capacitors C1P and C1M, and the top plates of the capacitors C1P and C1M are connected to the common mode potential VCM. Thereby, the capacitive elements C3P and C3M are respectively charged to the common mode potential VCM, and the charge corresponding to the difference between the common mode potential VCM and each of the input voltages VIP and VIM is sampled by each of the capacitors C1P and C1M.

Next, when the period φ1 is shifted to the period φ2, so that the switches SW3, SW7 and SW8 are turned on, the potential of the input node VA of the operational amplifier OPA is made to converge to the common mode potential VCM to which the capacitors C3P and C3M are charged beforehand. Actually, the potential of the input node VA of the operational amplifier OPA may be different from the common mode potential VCM at first, due to the parasitic capacitance, and the like, of the operational amplifier OPA, and of the capacitors C2P and C2M, but is made to converge to the common mode potential VCM after repetition of several cycles of the above operation.

In this way, when a switched capacitor integrator having a differential structure is configured as illustrated in FIG. 12, a differential input signal of any common mode potential can be inputted into the switched capacitor integrator.

The arithmetic operation circuit illustrated in FIG. 12 is a simple integrator, but a delta-sigma modulator is provided with an arithmetic operation (1-bit DAC and addition and integration) circuit, such as the arithmetic operation block U1 illustrated in FIG. 8, which integrates a value obtained by adding a binary reference voltage to an input voltage. FIG. 13 is a view illustrating an example of an arithmetic operation (1-bit DAC and addition and integration) circuit having a differential structure. In FIG. 13, reference characters C3P and C3M respectively denote reference capacitors. Reference characters SW9, SW10, SW11, SW12, SW13 and SW14 respectively denote switches. Reference character Vref denotes a reference voltage. The other components are the same as the components denoted by the same reference characters in FIG. 12, and hence the duplicated explanation thereof is omitted.

The conduction/non-conduction (on/off) of each of the switches SW9 and SW12 is controlled by the signal φ1. Conduction/non-conduction (on/off) of each of the switches SW10, SW11, SW13 and SW14 is controlled by the signal φ2 and a signal y (or an inverted signal yx of the signal y). When the signal φ2 is "1" and the signal y is "+1", the switches SW10 and SW14 are made conductive (turned on), and in the other cases, the switches SW10 and SW14 are made non-conductive (turned off). When the signal φ2 is "1" and the signal y is "−1", the switches SW11 and SW13 are made conductive (turned on), and in the other cases, the switches SW11 and SW13 are made non-conductive (turned off). Here, signal y corresponds to the feedback signal of the delta-sigma modulator, and has a 1 bit (binary) value as described above. Further, the capacitance values of the capacitors C3P and C3M are assumed to be the same.

[Patent Document 1] Japanese Laid-Open Patent Publication No. 08-125541
[Patent Document 2] Japanese Laid-Open Patent Publication No. 2002-261614
[Patent Document 3] Japanese Laid-Open Patent Publication No. 2001-358591
[Patent Document 4] U.S. Pat. No. 4,851,841
[Patent Document 5] U.S. Pat. No. 4,939,516
[Patent Document 6] U.S. Pat. No. 4,972,436
[Patent Document 7] U.S. Pat. No. 6,768,436
[Patent Document 8] Japanese Laid-Open Patent Publication No. 2007-300225
[Patent Document 9] Japanese Laid-Open Patent Publication No. 2006-41992
[Patent Document 10] Japanese National Publication of International Patent Application No. 10-508167
[Non-patent Document 1] Akira Yukawa, "*Oversampling A-D conversion technology*," Nikkei BP Company, 1990
[Non-patent Document 2] Richard Schreier and Gabor C. Temes (original authors), Takao Waho, Akira Yasuda (translation supervisors), "*Introduction to Delta-Sigma Type Analog/Digital Converter*," Maruzen, 2007
[Non-patent Document 3] B. E. Boser and B. A. Wooley, "The design of sigma-delta modulation analog-to-digital converters," *IEEE Journal of Solid-State Circuits*, Vol. 23, pp. 1298-1308, December 1988.
[Non-patent Document 4] B. P. Brandt, D. E. Wingard, and B. A. Wooley, "Second-order sigma-delta modulation for digital-audio signal acquisition," *IEEE journal of Solid-State Circuits*, Vol. 26, pp. 618-627, April 1991.
[Non-patent Document 5] M. W. Hauser, P. J. Hurst, and R. W. Brodersen, "MOS ADC-Filter Combination That Does Not Require Precision Analog Components," *IEEE International Solid-State Circuits Conference* 1985 *Digest of Technical Papers*, pp. 80-82, 1985.

The arithmetic operation circuit illustrated in FIG. 13, which is a diagram referred to in conceiving the embodiments, subtracts the signal y from the differential input signal and integrates the subtraction result, so as to output the integration result. Actually, the charge expressed by a product of the reference voltage Vref with each of the capacitance value of the reference capacitors C3P and C3M corresponds to the signal y.

In the arithmetic operation circuit illustrated in FIG. 13, in the φ1-period, the voltages VIP and VIM are respectively applied to the bottom plates of the capacitors C1P and C1M, and the top plates of the capacitors C1P and C1M are connected to the common mode potential VCM, so that the sampling of the differential input signal is performed. At this time, both the electrodes (the bottom plate and the top plate) of each of the capacitive elements C3P and C3M are connected to the common mode potential VCM, and hence the charge of the capacitive elements C3P and C3M becomes zero.

Next, when the φ1-period is shifted to the φ2-period, the switches SW3, SW7 and SW8 are turned on, and the charge stored in each of the capacitors C1P and C1M by the sampling is transferred to each of the capacitors C2P and C2M. Further, in the φ2-period, when the value of the signal y is "+1", the switches SW10 and SW14 are turned on. Thereby, the bottom plate of the capacitor C3P is connected to the reference voltage Vref, and the bottom plate of the capacitor C3M is connected to 0 (V). On the contrary, when the value of the signal y is "−1", the switches SW11 and SW13 are turned on. Thereby, the bottom plate of the capacitor C3P is connected to 0 (V), and the bottom plate of the capacitor C3M is connected to the reference voltage Vref. As a result, a value obtained by subtracting a signal corresponding to the reference voltage from each of the sampled input signals, or a value obtained by adding a signal corresponding to the reference voltage to each of the sampled input signals is integrated.

In the case where a delta-sigma modulator provided in a delta-sigma A/D converter is configured by using the arithmetic operation circuit illustrated in FIG. 13, there is a problem that the settable range of the reference voltage Vref is narrow. The reference voltage Vref defines the full scale range of A/D conversion in the delta-sigma A/D converter, and hence it is desirable that a user can arbitrarily set the reference voltage Vref. In the arithmetic operation circuit illustrated in FIG. 13, the charge of each of the capacitors C3P and C3M is discharged to zero in the φ1-period. In the next φ2-period, the respective switches are controlled so that the potential difference between the reference voltage Vref and 0 (V) is divided by the capacitance ratio of the capacitors C3P and C3M, and thereby the potential of the input node VA of the operational amplifier OPA becomes a voltage divided by the capacitance ratio of the capacitors C3P and C3M. That is, the potential of the input node VA is set to VA=Vref/2.

For this reason, when a low reference voltage Vref, which causes the potential (Vref/2) of the input node VA to become lower than the common mode input voltage range of the operational amplifier OPA, is used, the circuit does not operate. For example, when the power supply voltage VDD is 3.0 (V), and also the ground voltage VSS is 0 (V), and when the common mode potential VCM is 1.5 (V), and also the reference voltage Vref is 1.0 (V), the potential of the input node VA is made to converge to VA=Vref/2=0.5 (V). However, when the configuration in the operational amplifier OPA of the arithmetic operation circuit illustrated in FIG. 13 is the same as the configuration illustrated in FIG. 10, the differential pair is cut off, so that a desired operation is not performed. In order to normally operate the circuit, the reference voltage Vref may be set as Vref>2.0 (V). In such case, for example, the voltage of 1.2 (V) generated in the band gap reference circuit is not used as the reference voltage Vref of the arithmetic operation circuit illustrated in FIG. 13. In order to increase the flexibility of design for a user of a semiconductor integrated circuit, it is preferred that the settable voltage range of the reference voltage Vref is as wide as possible.

SUMMARY

According to an aspect of the embodiments, an A/D converter includes a modulator which performs delta-sigma modulation of an inputted differential analog signal, and a decimation filter which generates digital data on the basis of the output of the modulator. The modulator includes a first capacitor and a second capacitor each of which samples an input signal, a third capacitor and a fourth capacitor which are connected to the first electrode of the first capacitor and which sample a first reference voltage or a second reference voltage, a fifth capacitor and a sixth capacitor which are connected to the first electrode of the second capacitor and which sample the first reference voltage or the second reference voltage, and at least one arithmetic operation circuit including an arithmetic operator which performs addition or subtraction of the charges sampled by the respective capacitors to obtain an addition or subtraction result, and which integrates the addition or subtraction result, so as to output an integration result.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a view illustrating a configuration example of an arithmetic operation (1-bit DAC and addition and integration) circuit of a delta-sigma A/D converter according to a present embodiment;

FIG. 2C is a view for explaining an operation of the arithmetic operation circuit illustrated in FIG. 1;

FIG. 3 is a view illustrating another configuration example of an arithmetic operation (1-bit DAC and addition and integration) circuit of a delta-sigma A/D converter according to a present embodiment;

FIG. 5 is a view illustrating a flow of operations of the delta-sigma modulator illustrated in FIG. 4;

FIGS. 9A and 9B are a view illustrating a configuration example of an arithmetic operation (addition and integration) circuit having a single end structure;

FIG. 10 is a view illustrating a circuit configuration of an input portion of an operational amplifier;

FIG. 13 is a reference view of an arithmetic operation (1-bit DAC and addition and integration) circuit having a differential structure.

DESCRIPTION OF EMBODIMENTS

In the following, embodiments will be described with reference to the accompanying drawings.

Figure 6:
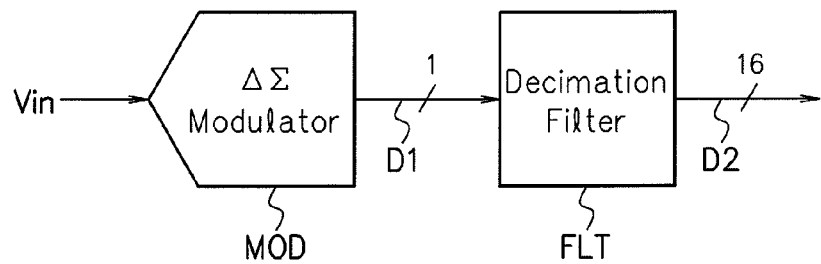
FIG. 6 is a view illustrating a configuration example of a delta-sigma A/D converter.
Figure 7:
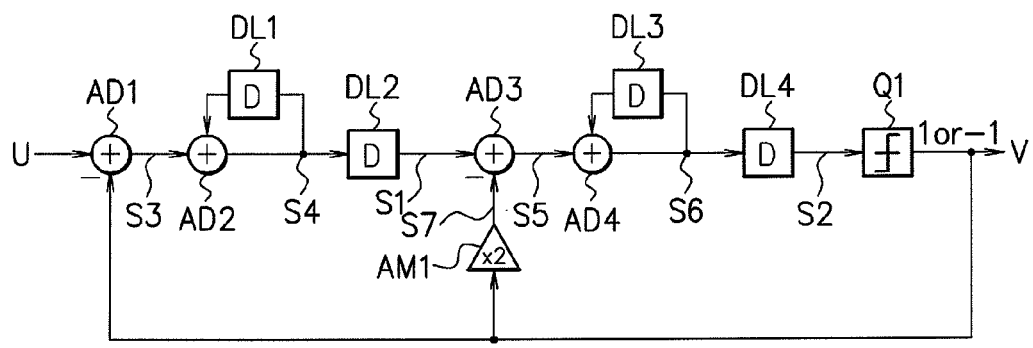
FIG. 7 is a view illustrating an example of signal paths for realizing the delta-sigma modulator.
Figure 8:
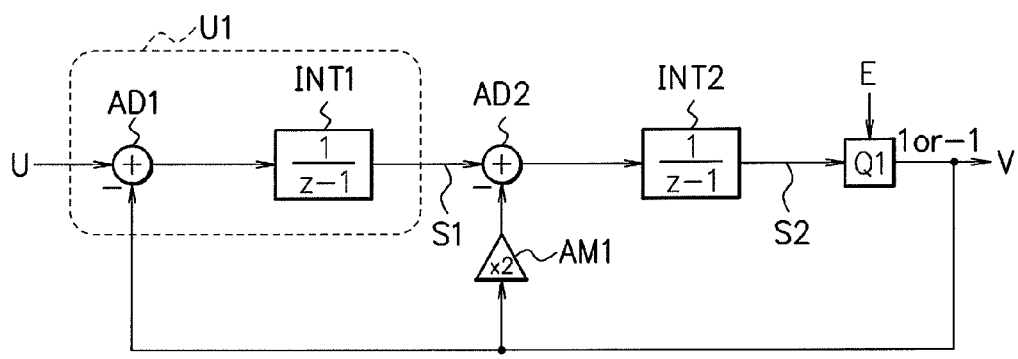
FIG. 8 is a view in which the signal paths of the delta-sigma modulator illustrated in FIG. 7 are illustrated by z operators.
Figure 11:
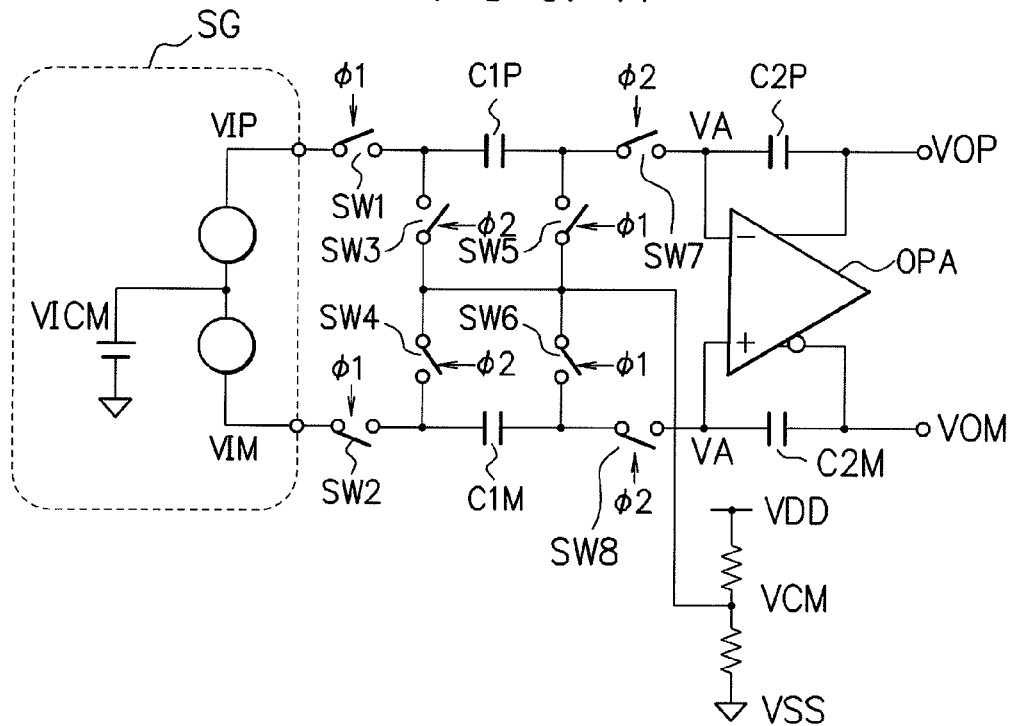
FIG. 11 is a view illustrating a configuration example of a switched capacitor integrator having a differential structure.
Figure 12:
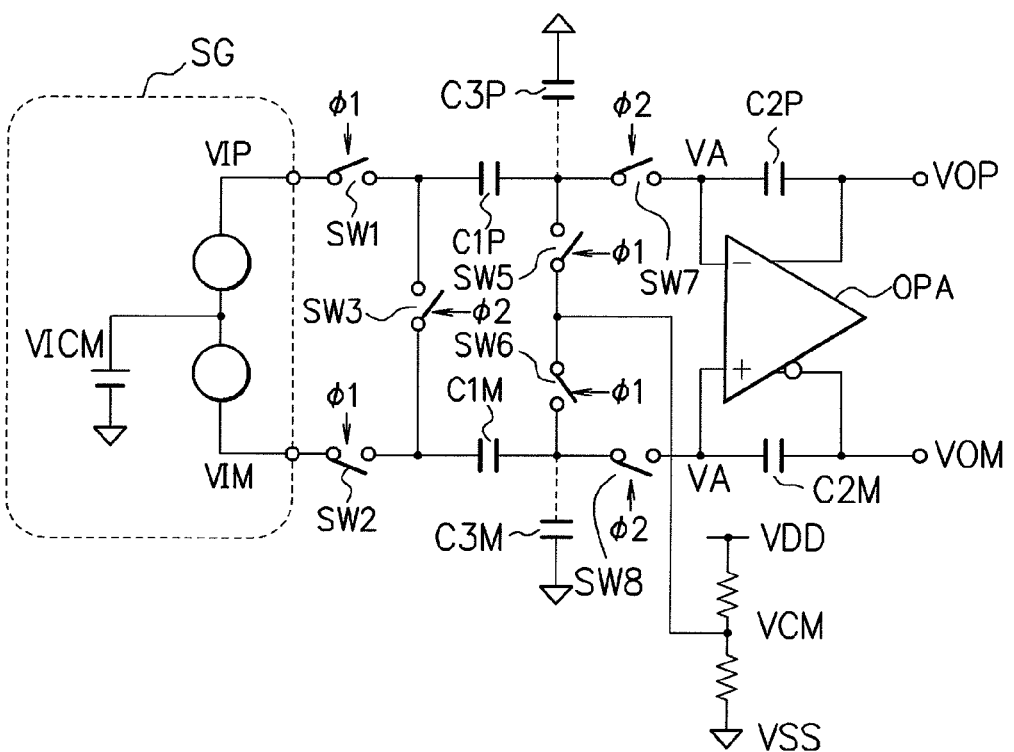
FIG. 12 is a view illustrating a configuration example of a switched capacitor integrator having a differential structure.

FIG. 1 is a view illustrating an example of a circuit configuration of an arithmetic operation (1-bit DAC and addition and integration) circuit of a delta-sigma A/D converter according to an embodiment. The configuration of the delta-sigma A/D converter according to the present embodiment is the same as the configuration of the delta-sigma A/D converter illustrated in FIG. 6. That is, the delta-sigma A/D converter according to the present embodiment includes a delta-sigma modulator which performs delta-sigma modulation of an inputted differential analog signal, and a decimation filter which generates an A/D conversion result (digital data) on the basis of the delta-sigma modulated signal.

The arithmetic operation (1-bit DAC and addition and integration) circuit having the differential structure illustrated in FIG. 1 is an arithmetic operation circuit which integrates a value obtained by adding a binary reference voltage (reference voltage) to an input voltage, and is used, for example, as an arithmetic operation circuit at the first stage of a delta-sigma modulator provided in a delta-sigma A/D converter.

In FIG. 1, reference characters C1P and C1M respectively denote sampling capacitors, and reference characters C2P and C2M respectively denote integration capacitors. Reference characters C3PA, C3PB, C3MA and C3 MB respectively denote reference capacitors. That is, in the arithmetic operation circuit according to the present embodiment, the two reference capacitors C3PA and C3PB are provided at the positive side node, and the two reference capacitors C3MA and C3MB are provided at the negative side node. The capacitance values of the capacitors C1P and C1M are set to the same capacitance value of C1. The capacitance values of the capacitors C2P and C2M are set to the same capacitance value of C2. The capacitance values of the capacitors C3PA, C3PB, C3MA and C3MB are set to the same capacitance value of C3.

Reference character OPA denotes a fully differential operational amplifier. Reference character VIP denotes a positive side input node of a differential analog signal, and reference character VIM denotes a negative side input node of the differential analog signal. Reference character VA denotes an input node of the operational amplifier OPA, reference character VOP denotes a positive side output node of the operational amplifier OPA, and reference character VOM denotes a negative side output node of the operational amplifier OPA. Note that reference characters VOP and VOM also respectively denote the output nodes of the differential signal in the arithmetic operation circuit illustrated in FIG. 1. In the following, the name of a signal inputted or outputted to or from each node, and the value of a voltage of the each node are also suitably represented by using the same reference character as the reference character given to the node. Reference character VCM denotes a common mode potential in the arithmetic operation circuit, and reference character Vref denotes a reference voltage (reference signal). For example, the common mode potential VCM is assumed to be an intermediate potential between a power supply voltage VDD and a ground voltage VSS (0 (V)).

Reference characters SW1 to SW15 denote switches. The conduction/non-conduction (on/off) of each of the switches SW1, SW2, SW4 and SW5 is controlled by a signal φ1. The conduction/non-conduction (on/off) of each of the switches SW3, SW6 and SW7 is controlled by a signal φ2. The conduction/non-conduction (on/off) of each of the switches SW8, SW10, SW12 and SW14 is controlled by the signal φ1, the signal φ2, and a signal y (or an inverted signal yx of the signal y). The conduction/non-conduction (on/off) of each of the switches SW9, SW11, SW13 and SW15 is controlled by the signal φ2, and the signal y (or the inverted signal yx of the signal y). The signal y is an output of the delta-sigma modulator (in particular, an output of a quantizer provided in the delta-sigma modulator), and has a binary (1 bit) value of "+1" or "−1".

The switches SW1, SW2, SW4 and SW5 are made conductive (turned on) in the case where the signal φ1 is "1" (active), and are made non-conductive (turned off) in the other case. The switches SW3, SW6 and SW7 are made conductive (turned on) in the case where the signal φ2 is "1" (active), and are made non-conductive (turned off) in the other case.

The switches SW8 and SW12 are made conductive (turned on) in the case where the signal φ1 is "1", or where the signal φ2 is "1" and also the signal y=−1, and are made non-conductive (turned off) in the other case. The switches SW9 and SW13 are made conductive (turned on) in the case where the signal φ2 is "1" and also the signal y=+1, and are made non-conductive (turned off) in the other case.

The switches SW10 and SW14 are made conductive (turned on) in the case where the signal φ1 is "1", or where the signal φ2 is "1" and also the signal y=+1, and are made non-conductive (turned off) in the other case. The switches SW11 and SW15 are made conductive (turned on) in the case where the signal φ2 is "1" and also the signal y=−1, and are made non-conductive (turned off) in the other case.

One electrode (bottom plate) of the capacitor C1P is connected to the positive side input node VIP via the switch SW1, and the other electrode (top plate) of the capacitor C1P is connected to the negative side input node VA of the operational amplifier OPA via the switch SW6. One electrode (bottom plate) of the capacitor C1M is connected to the negative side input node VIM via the switch SW2, and the other electrode (top plate) of the capacitor C1M is connected to the positive side input node VA of the operational amplifier OPA via the switch SW7. Further, the bottom plates of the capacitors C1P and C1M are mutually connected via the switch SW3. Further, the top plate of the capacitor C1P is connected to a common mode potential VCM via the switch SW4, and the top plate of the capacitor C1M is connected to the common mode potential VCM via the switch SW5.

One electrode of the capacitor C2P is connected to the positive side output node VOP of the operational amplifier OPA, and the other electrode of the capacitor C2P is connected to the negative side input node VA of the operational amplifier OPA. One electrode of the capacitor C2M is connected to the negative side output node VOM of the operational amplifier OPA, and the other electrode of the capacitor C2M is connected to the positive side input node VA of the operational amplifier OPA.

One electrode (bottom plate) of the capacitor C3PA is connected to the ground voltage VSS (0 (V)) via the switch SW8, and is connected to the reference voltage Vref via the switch SW9. One electrode (bottom plate) of the capacitor C3PB is connected to the reference voltage Vref via the switch SW10, and is connected to the ground voltage VSS (0 (V)) via the switch SW11. The other electrode (top plate) of each of the capacitors C3PA and C3PB is connected to the common mode potential VCM via the switch SW4, and is connected to the negative side input node VA of the operational amplifier OPA via the switch SW6.

One electrode (bottom plate) of the capacitor C3MA is connected to the reference voltage Vref via the switch SW12, and is connected to the ground voltage VSS (0 (V)) via the switch SW13. One electrode (bottom plate) of the capacitor C3MB is connected to the ground voltage VSS (0 (V)) via the switch SW14, and is connected to the reference voltage Vref via the switch SW15. The other electrode (top plate) of each of the capacitors C3MA and C3MB is connected to the common mode potential VCM via the switch SW5, and is connected to the positive side input node VA of the operational amplifier OPA via the switch SW7.

In the circuit illustrated in FIG. 1, the φ1-period in which the signal φ1 is "1", and the φ2-period in which the signal φ2 is "1" are alternately repeated on the basis of a clock signal, or the like. Thereby, a signal obtained by subtracting or adding a reference signal from or to an inputted differential analog signal (VIP−VIM) is integrated, and the integration result is outputted as a differential signal (VOP−VOM). Whether the reference signal is subtracted or added from or to the inputted differential analog signal is determined by the signal y.

Figure 2A:
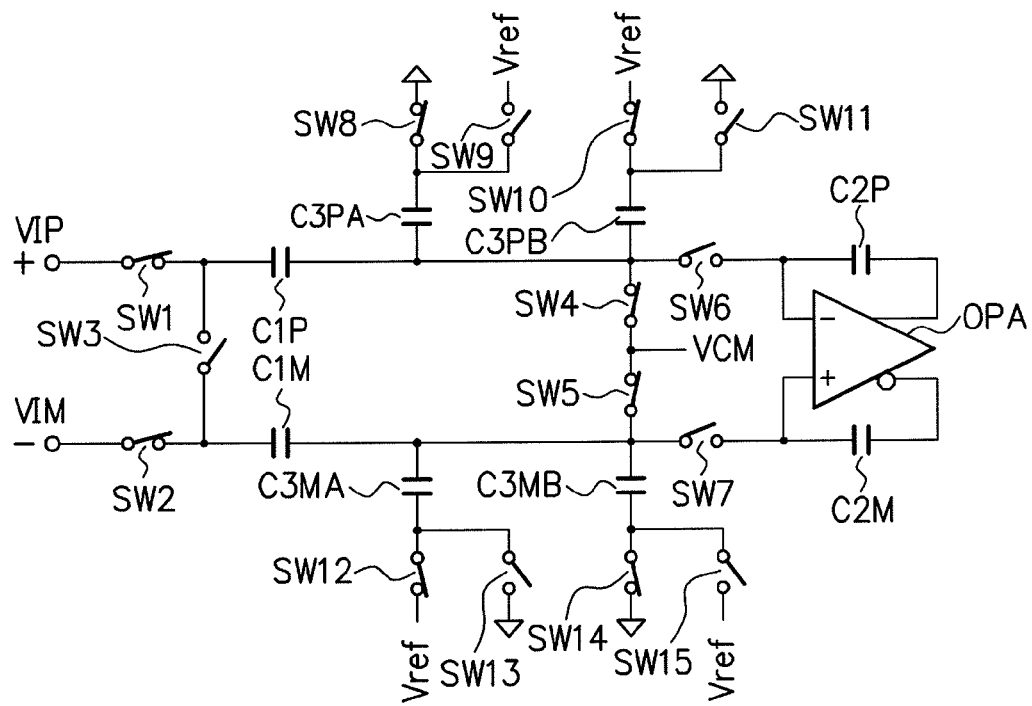
FIG. 2A is a view for explaining an operation of the arithmetic operation circuit illustrated in FIG. 1.

In the φ1-period, the respective switches SW1 to SW15 are controlled as illustrated in FIG. 2A, so that the sampling of the signals is performed. That is, the switches SW1, SW2, SW4, SW5, SW8, SW10, SW12 and SW14 are made conductive (turned on), and the switches SW3, SW6, SW7, SW9, SW11, SW13 and SW15 are made non-conductive (turned off).

Thereby, the voltage VIP is applied to the bottom plate of the capacitor C1P, and the top plate of the capacitor C1P is connected to the common mode potential VCM. The voltage VIM is applied to the bottom plate of the capacitor C1M, and the top plate of the capacitor C1M is connected to the common mode potential VCM. Therefore, a charge corresponding to the difference between the common mode potential VOM and input voltage VIP is sampled by the capacitor C1P, and a charge corresponding to the difference between the common mode potential VCM and input voltage VIM is sampled by the capacitor C1M. The bottom plates of the capacitors C3PA and C3MB are connected to the ground voltage VSS (0 (V)), and the bottom plates of the capacitors C3PB and C3MA are connected to the reference voltage Vref. The top plates of capacitors C3PA, C3PB, C3MA and C3MB are connected to the common mode potential VCM. Therefore, each of the capacitors C3PA and C3 MB is charged to the common mode potential VCM, and the bottom plate of each of the capacitors C3PB and C3MA is charged to the voltage (the common mode potential VCM—the reference voltage Vref).

Figure 2B:
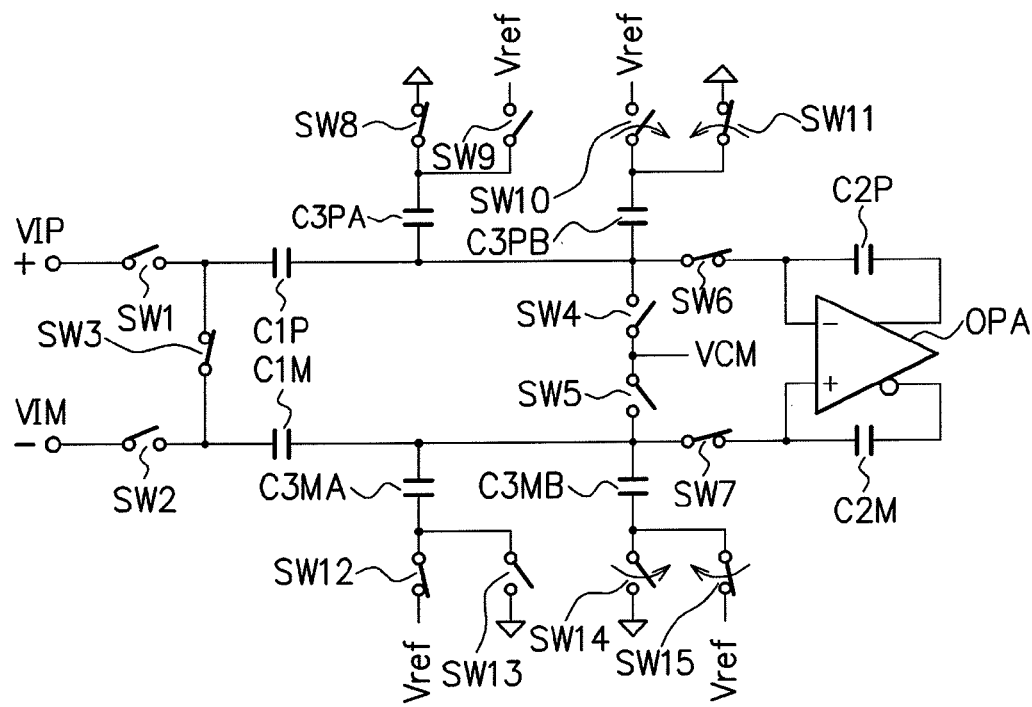
FIG. 2B is a view for explaining an operation of the arithmetic operation circuit illustrated in FIG. 1.

In the φ2-period, in the case where the reference signal is added to the input signal, that is, where the signal y=−1, the respective switches SW1 to SW15 are controlled as shown in FIG. 2B, so that the addition and integration of the signals are performed. That is, the switches SW1, SW2, SW4, SW5, SW9, SW10, SW13 and SW14 are made non-conductive (turned off), and the switches SW3, SW6, SW7, SW8, SW11, SW12 and SW15 are made conductive (turned on).

Thereby, the connection of the bottom plates of the capacitors C3PB and C3MB is switched so that the bottom plate of the capacitor C3PB is connected to the ground voltage VSS (0 (V)) and so that the bottom plate of the capacitor C3MB is connected to the reference voltage Vref. The connection of the bottom plates of capacitors C3PA and C3MA is not changed. This operation only causes the voltage of the bottom plate of the capacitor C3PB to be changed from the reference voltage Vref to the ground voltage V SS (0 (V)), and the voltage of the bottom plate of the capacitor C3MB to be changed from the ground voltage VSS (0 (V)) to the reference voltage Vref. For this reason, the potential of the input node VA in the φ2-period becomes the common mode potential VCM. More particularly, the capacitors C3PB and C3MB perform sampling in the φ1-period, and forms, in the φ2-period, a capacitive division circuit to determine the potential of the input node VA. In this state, the following expression is established.

$$(VCM-0)C3+(VCM-Vref)C3=(VA-Vref)C3+(VA-0)C3$$

Therefore, the following expression is obtained.

$$VA=VCM$$

That is, the potential of the input node VA becomes the common mode potential VCM in the circuit regardless of the reference voltage Vref and common mode potential VICM of the inputted differential analog signal.

Further, in the φ2-period, in the case where the reference signal is subtracted from the input signal, that is, where the signal y=+1, the respective switches SW1 to SW15 are controlled as illustrated in FIG. 2C, so that the addition and integration of the signals are performed. That is, the switches SW1, SW2, SW4, SW5, SW8, SW11, SW12 and SW15 are made non-conductive (turned off), and the switches SW3, SW6, SW7, SW9, SW10, SW13 and SW14 are made conductive (turned on).

Thereby, the connection of the bottom plates of the capacitors C3PA and C3MA is switched so that the bottom plate of the capacitor C3PA is connected to the reference voltage Vref, and so that the bottom plate of the capacitor C3MA is connected to the ground voltage VSS (0 (V)). The connection of the bottom plates of the capacitors C3PB and C3MB is not changed. This operation only causes the voltage of the bottom plate of the capacitor C3PA to be changed from the ground voltage VSS (0 (V)) to the reference voltage Vref, and the voltage of the bottom plate of the capacitor C3MA to be changed from the reference voltage Vref to the ground voltage VSS (0 (V)). Therefore, also when the reference signal is subtracted from the input signal, the potential of the input node VA in the φ2-period becomes the common mode potential VCM in the circuit regardless of the reference voltage Vref and the common mode potential VICM of the inputted differential analog signal.

As described above, when a delta-sigma A/D converter is configured by using the arithmetic operation circuit illustrated in FIG. 1, a differential analog signal having any common mode potential can be inputted, and any reference voltage can be set.

Further, the 1-bit delta-sigma A/D converter, in which a binary DAC is incorporated, does not have nonlinearity of the incorporate DAC and hence has an advantage that the linearity of the A/D conversion can be improved. This advantage is not lost even when the delta-sigma A/D converter is configured by using the arithmetic operation circuit illustrated in FIG. 1. In the state illustrated in FIG. 2B, only the reference capacitors C3PB and C3MB contribute the circuit operation.

In the state illustrated in FIG. 2C, only the reference capacitors C3PA and C3MA contribute the circuit operation. That is, the capacitance used at the time when the reference signal is added to the input signal, and the capacitance used at the time when the reference signal is subtracted from the input signal are always equal to each other, and hence the nonlinearity is not caused.

FIG. 3 is a view illustrating another example of a circuit configuration of an arithmetic operation (1-bit DAC and addition and integration) circuit of a delta-sigma A/D converter according to an embodiment. FIG. 3 illustrates an example of an embodiment of a delta-sigma A/D converter using correlated double sampling (CDS).

In FIG. 3, reference characters C1P and C1M respectively denote sampling capacitors, and reference characters C2P and C2M respectively denote integration capacitors. Reference characters C3PA, C3PB, C3MA and C3MB respectively denote reference capacitors. That is, in the arithmetic operation circuit according to the present embodiment, two reference capacitors C3PA and C3PB are provided at the positive side node, and two reference capacitors C3MA and C3MB are provided at the negative side node. Each of the capacitance values of the capacitors C1P and C1M is set to the same capacitance value of C1, and each of the capacitance values of the capacitors C2P and C2M is set to the same capacitance value of C2. Each of the capacitance values of the capacitors C3PA, C3PB, C3MA and C3MB is set to the same capacitance value of C3.

Reference character OPA denotes a fully differential operational amplifier. Reference character VIP denotes a positive side input node of a differential analog signal, and reference character VIM denotes a negative side input node of the differential analog signal. Reference character VOP denotes a positive side output node of the operational amplifier OPA, and reference character VOM denotes a negative side output node of the operational amplifier OPA. Note that reference characters VOP and VOM also respectively denote the output nodes of the differential signal in the arithmetic operation circuit illustrated in FIG. 3. Reference character Vref denotes a reference voltage (reference signal).

Reference characters SW1 to SW3, S4 to S7, and SW8 to SW15 denote switches. In the case where a signal φ1 is "1", the switches SW1, SW2, S6 and S7 are made conductive (turned on), and in the other case, the switches SW1, SW2, S6 and S7 are made non-conductive (turned off). In the case where a signal 42 is "1", the switches SW3, S4 and S5 are made conductive (turned on), and in the other case, the switches SW3, S4 and S5 are made non-conductive (turned off).

In the case where the signal φ1 is "1", or where the signal φ2 is "1" and also a signal y=−1, the switches SW8 and SW12 are made conductive (turned on), and in the other case, the switches SW8 and SW12 are made non-conductive (turned off). The signal y is an output of the delta-sigma modulator (more particularly, an output of a quantizer provided in the delta-sigma modulator), and has a binary (1 bit) value of "+1" or "−1". In the case where the signal φ2 is "1" and where the signal y=+1, the switches SW9 and SW13 are made conductive (turned on), and in the other case, the switches SW9 and SW13 are made non-conductive (turned off).

In the case where the signal φ1 is "1", or where the signal φ2 is "1" and also the signal y=+1, the switches SW10 and SW14 are made conductive (turned on), and in the other case, the switches SW10 and SW14 are made non-conductive (turned off). In the case where the signal φ2 is "1" and also the signal y=−1, the switches SW11 and SW15 are made conductive (turned on), and in the other case, the switches SW11 and SW15 are made non-conductive (turned off).

One electrode (bottom plate) of the capacitor C1P is connected to the positive side input node VIP via the switch SW1, and the other electrode (top plate) of the capacitor C1P is connected to the negative side input node of the operational amplifier OPA. One electrode (bottom plate) of the capacitor C1M is connected to the negative side input node VIM via the switch SW2, and the other electrode (top plate) of the capacitor C1M is connected to the positive side input node of the operational amplifier OPA. Further, the bottom plates of the capacitors C1P and C1M are mutually connected via the switch SW3.

One electrode of the capacitor C2P is connected to the positive side output node VOP of the operational amplifier OPA, and the other electrode of the capacitor C2P is connected to the negative side input node of the operational amplifier OPA via the switch S4. One electrode of the capacitor C2M is connected to the negative side output node VOM of the operational amplifier OPA, and the other electrode of the capacitor C2M is connected to the positive side input node of the operational amplifier OPA via the switch S5. That is, the switch S4 and the capacitor C2P are connected in series between the negative side input node and the positive side output node VOP of the operational amplifier OPA, and the switch S5 and the capacitor C2M are connected in series between the positive side input node and the negative side output node VOM of the operational amplifier OPA.

One electrode (bottom plate) of the capacitor C3PA is connected to a ground voltage VSS (0 (V)) via the switch SW8, and is connected to the reference voltage Vref via the switch SW9. One electrode (bottom plate) of the capacitor C3PB is connected to the reference voltage Vref via the switch SW10, and is connected to the ground voltage VSS (0 (V)) via the switch SW11. The other electrode (top plate) of each of the capacitors C3PA and C3PB is connected to the negative side input node of the operational amplifier OPA.

One electrode (bottom plate) of the capacitor C3MA is connected to the reference voltage Vref via the switch SW12, and is connected to the ground voltage VSS (0 (V)) via the switch SW13. One electrode (bottom plate) of the capacitor C3MB is connected to the ground voltage VSS (0 (V)) via the switch SW14, and is connected to the reference voltage Vref via the switch SW15. The other electrode (top plate) of each of the capacitors C3MA and C3MB is connected to the positive side input node of the operational amplifier OPA.

The positive side output node VOP and the negative side input node of the operational amplifier OPA are connected to each other via the switch S6. The negative side output node VOM and the positive side input node of the operational amplifier OPA are connected to each other via the switch S7.

The arithmetic operation circuit illustrated in FIG. 3 is provided with the CDS mechanism in order to avoid the problem that the 1/f noise of the MOS transistor, which noise is generated in the operational amplifier, degrades the A/D conversion characteristics. In the arithmetic operation circuit illustrated in FIG. 3, in the $\phi1$-period, the negative side input node and the positive side output node of the operational amplifier OPA are connected to each other via the switch S6, and the positive side input node and the negative side output node of the operational amplifier OPA are connected to each other via the switch S7. In this case, the input offset voltage and the voltage due to noise (noise voltage) of the operational amplifier OPA are generated between the two input nodes of the operational amplifier OPA. Therefore, the charge due to the input offset voltage and the noise voltage of the operational amplifier OPA is sampled by the capacitors C1P and C1M together with the charge due to a signal.

Next, when the $\phi1$-period is shifted to the $\phi2$-period, the charge due to the input offset voltage and the noise voltage of the operational amplifier OPA and the charge due to the signal, which charges are sampled by the capacitors C1P and C1M, are transferred to the capacitors C2P and C2M, respectively. Here, even in the $\phi2$-period, the input offset voltage and the noise voltage of the operational amplifier OPA exist, but are canceled by the charges sampled in the $\phi1$-period and respectively transferred from the capacitors C1P and C1M. As a result, since the input offset voltage is removed, and since the noise at least in the frequency range lower than the sampling frequency is also removed, highly precise A/D conversion can be performed.

In the case where a delta-sigma A/D converter is configured by using the arithmetic operation circuit illustrated in FIG. 3, a differential analog signal having any common mode potential can be inputted, and any reference voltage can be set, similarly to the arithmetic operation circuit illustrated in FIG. 1.

Figure 4:
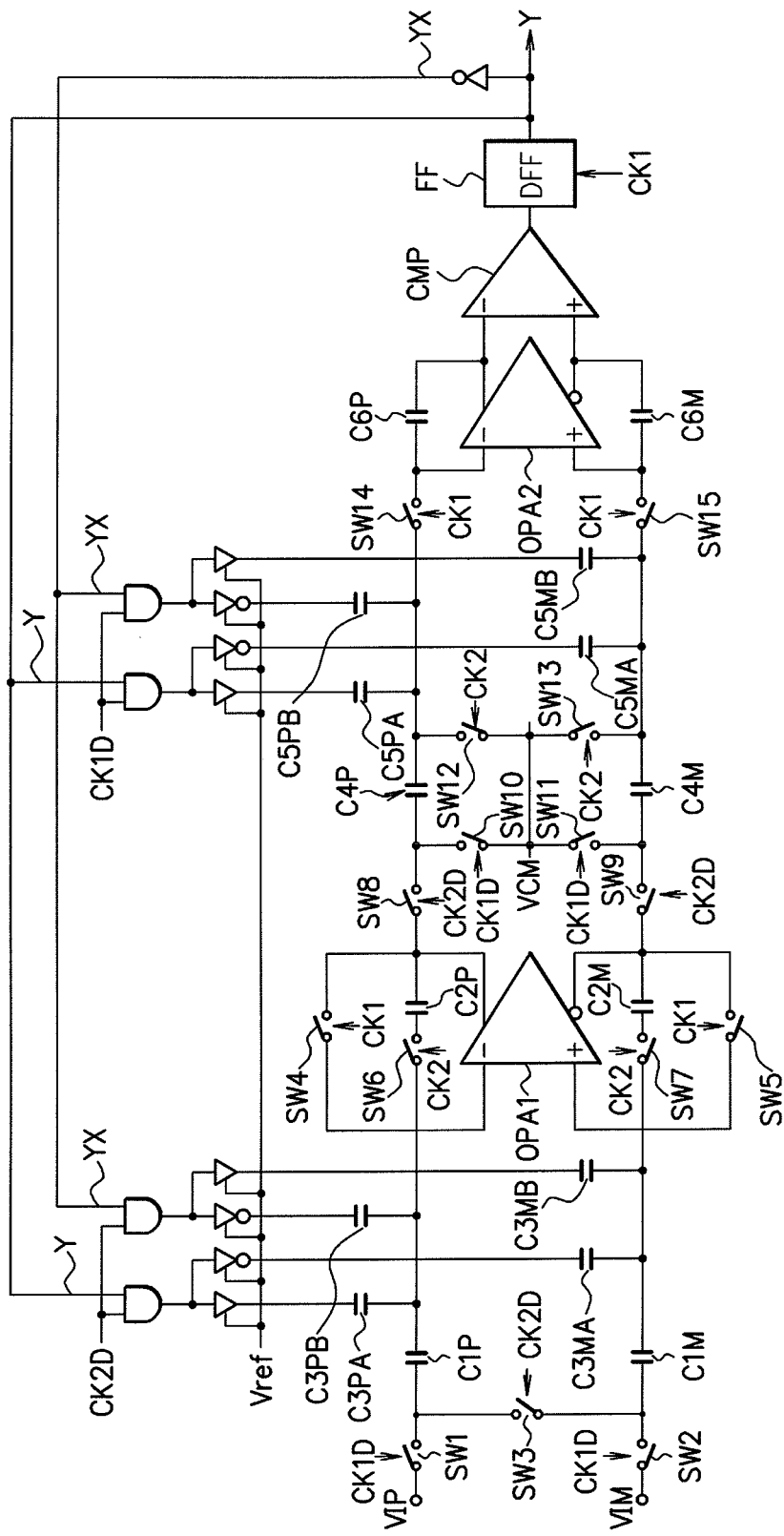
FIG. 4 is a view illustrating a configuration example of a 1-bit second-order delta-sigma modulator according to a present embodiment.

FIG. 4 is a view illustrating an example of a circuit configuration of a 1-bit second-order delta-sigma modulator according to the present embodiment.

In FIG. 4, reference characters C1P and C1M respectively denote sampling capacitors of a first integrator, and reference characters C2P and C2M respectively denote integration capacitors of the first integrator. Reference characters C3PA, C3PB, C3MA and C3MB respectively denote reference capacitors of the first integrator. Reference characters C4P and C4M respectively denote sampling capacitors of a second integrator, and reference characters C6P and C6M respectively denote integration capacitors of the second integrator. Reference characters C5PA, C5PB, C5MA and C5MB respectively denote reference capacitors of the second integrator. Each of the capacitance values of the capacitors C1P and C1M is set to the same capacitance value, and each of the capacitance values of the capacitors C2P and C2M is set to the same capacitance value. Each of the capacitance values of the capacitors C3PA, C3PB, C3MA and C3MB is set to the same capacitance value. Each of the capacitance values of the capacitors C4P and C4M is set to the same capacitance value, and each of the capacitance values of the capacitors C5PA, C5PB, C5MA and C5MB is set to the same capacitance value. Each of the capacitance values of the capacitors C6P and C6M is set to the same capacitance value.

Reference characters OPA1 and OPA2 denote fully differential operational amplifiers, reference character CMP denotes a comparator, and reference character FF denotes a D flip-flop. Reference character VIP denotes a positive side input node of a differential analog signal, and reference character VIM denotes a negative side input node of the differential analog signal. Reference character VCM denotes a common mode potential, and reference character Vref denotes a reference voltage (reference signal). Reference character Y denotes an output of the delta-sigma modulator, and reference character YX denotes an inverted signal of the output Y.

Reference characters SW1 to SW15 denote switches. In the case where a clock signal CK1 is "1", the switches SW4, SW5, SW14 and SW15 are made conductive (turned on), and in the other case, the switches SW4, SW5, SW14 and SW15 are made non-conductive (turned off). In the case where a clock signal CK1D is "1", the switches SW1, SW2, SW1G and SW11 are made conductive (turned on), and in the other case, the switches SW1, SW2, SW10 and SW11 are made non-conductive (turned off). In the case where a clock signal CK2 is "1", the switches SW6, SW7, SW12 and SW13 are made conductive (turned on), and in the other case, the switches SW6, SW7, SW12 and SW13 are made non-conductive (turned off). In the case where a clock signal CK2D is "1", the switches SW3, SW8 and SW9 are made conductive (turned on), and in the other case, the switches SW3, SW8 and SW9 are made non-conductive (turned off).

Here, the clock signal CK1D is a clock signal obtained by slightly delaying the clock signal CK1, and the clock signal CK2D is a clock signal obtained by slightly delaying the clock signal CK2. The clock signal CK1 and the clock signal CK2 have polarities opposite to each other, and have a non-overlapping relationship in which both the clock signals CK1 and CK2 are not simultaneously set to "1". More particularly, when at least one of the clock signals CK1 and CK1D is "1", both the clock signals CK2 and CK2D are "0", and when at least one of the clock signals CK2 and CK2D is "1", both the clock signals CK1 and CK1D are "0".

One electrode (bottom plate) of the capacitor C1P is connected to the positive side input node VIP via the switch SW1, and the other electrode (top plate) of the capacitor C1P is connected to the negative side input node of the operational amplifier OPA1. One electrode (bottom plate) of the capacitor C1M is connected to the negative side input node VIM via the switch SW2, and the other electrode (top plate) of the capacitor C1M is connected to the positive side input node of the operational amplifier OPA1. Further, the bottom plates of the capacitors C1P and C1M are mutually connected via the switch SW3.

One electrode of the capacitor C2P is connected to the positive side output node of the operational amplifier OPA1, and the other electrode of the capacitor C2P is connected to the negative side input node of the operational amplifier OPA1 via the switch SW6. One electrode of the capacitor C2M is connected to the negative side output node of the operational amplifier OPA1, and the other electrode of the capacitor C2M is connected to the positive side input node of the operational amplifier OPA1 via the switch SW7. Further, the positive side output node and the negative side input node of operational amplifier OPA1 are mutually connected via the switch SW4, and the negative side output node and the positive side input node of the operational amplifier OPA1 are mutually connected via the switch SW5.

In the case where the clock signal CK2D is "1" and where the output Y is "1", one electrode (bottom plate) of the capacitor C3PA is connected to the reference voltage Vref, and in the other case, the one electrode (bottom plate) of the capacitor C3PA is connected to a ground voltage VSS (0 (V)). In the case where the clock signal CK2D is "1" and where the output Y is "1", one electrode (bottom plate) of the capacitor C3MA is connected to the ground voltage VSS (0 (V)), and in the other case, the one electrode (bottom plate) of the capacitor C3MA is connected to the reference voltage Vref. Similarly, in the case where the clock signal CK2D is "1" and where the inverted signal YX is "1", one electrode (bottom plate) of the capacitor C3PB is connected to the ground voltage VSS (0 (V)), and in the other case, the one electrode (bottom plate) of the capacitor C3PB is connected to the reference voltage Vref. In the case where the clock signal CK2D is "1" and where the inverted signal YX is "1", one electrode (bottom plate) of the capacitor C3MB is connected to the reference voltage Vref, and in the other case, the one electrode (bottom plate) of the capacitor C3MB is connected to the ground voltage VSS (0 (V)). The other electrodes (top plates) of the capacitors C3PA and C3PB are connected to the negative side input node of the operational amplifier OPA1, and the other electrodes (top plates) of the capacitors C3MA and C3MB are connected to the positive side input node of the operational amplifier OPA1.

One electrode (bottom plate) of the capacitor C4P is connected to the positive side output node of the operational amplifier OPA1 via the switch SW8, and the other electrode (top plate) of the capacitor C4P is connected to the negative side input node of the operational amplifier OPA2 via the switch SW14. One electrode (bottom plate) of the capacitor C4M is connected to the negative side output node of the operational amplifier OPA1 via the switch SW9, and the other electrode (top plate) of the capacitor C4M is connected to the positive side input node of the operational amplifier OPA2 via the switch SW15. Further, the bottom plates of the capacitors C4P and C4M are connected to the common mode potential VCM respectively via the switches SW10 and SW11, and the top plates of the capacitors C4P and C4M are connected to the common mode potential VCM respectively via the switches SW12 and SW13.

One electrode of the capacitor C6P is connected to the positive side output node of the operational amplifier OPA2, and the other electrode of the capacitor C6P is connected to the negative side input node of the operational amplifier OPA2. One electrode of the capacitor C6M is connected to the negative side output node of the operational amplifier OPA2, and the other electrode of the capacitor C6M is connected to the positive side input node of the operational amplifier OPA2.

In the case where the clock signal CK1D is "1" and where the output Y is "1", one electrode (bottom plate) of the capacitor C5PA is connected to the reference voltage Vref, and in the other case, the one electrode (bottom plate) of the capacitor C5PA is connected to the ground voltage VSS (0 (V)). In the case where the clock signal CK1D is "1" and where the output Y is "1", one electrode (bottom plate) of the capacitor C5MA is connected to the ground voltage VSS (0 (V)), and in the other case, the one electrode (bottom plate) of the capacitor C5MA is connected to the reference voltage Vref. Similarly, in the case where the clock signal CK1D is "1" and where the inverted signal YX is "1", one electrode (bottom plate) of the capacitor C5PB is connected to the ground voltage VSS (0 (V)), and in the other case, the one electrode (bottom plate) of the capacitor C5PB is connected to the reference voltage Vref. In the case where the clock signal CK1D is "1" and where the inverted signal YX is "1", one electrode (bottom plate) of the capacitor C5MB is connected to the reference voltage Vref, and in the other case, the one electrode (bottom plate) of the capacitor C5MB is connected to the ground voltage VSS (0 (V)). The other electrodes (top plates) of the capacitors C5PA and C5PB are connected to the negative side input node of the operational amplifier OPA2 via the switch SW14, and the other electrodes (top plates) of the capacitors C5MA and C5MB are connected to the positive side input node of the operational amplifier OPA2 via the switch SW15.

The negative side input node of the comparator CMP is connected to the positive side output node of the operational amplifier OPA2, and the positive side input node of the comparator CMP is connected to the negative side output node of the operational amplifier OPA2. The D flip-flop FF is operated by the clock signal CK1, and takes in the output of the comparator CMP to output the taken-in signal as the output Y.

In the delta-sigma modulator illustrated in FIG. 4, since noise of the second integrator hardly affects the A/D conversion characteristics, the function of CDS (correlated double sampling) is included only in the first integrator, and the function of CDS is not included in the second integrator. The first integrator in the delta-sigma modulator illustrated in FIG. 4 corresponds to the arithmetic operation circuit illustrated in FIG. 3, and the second integrator in the delta-sigma modulator illustrated in FIG. 4 corresponds to the arithmetic operation circuit illustrated in FIG. 1.

The first integrator samples the signal during the period in which the clock signal CK1 (CK1D) is "1", and performs addition and integration of the signal during the period in which the clock signal CK2 (CK2D) is "1". The second integrator samples the signal during the period in which the clock signal CK2 (CK2D) is "1", and performs addition and integration of the signal during the period in which the clock signal CK1 (CK1D) is "1".

The voltage of the bottom plates of the reference capacitors C3PA, C3PB, C3MA and C3MB in the first integrator is controlled by the output Y, the inverted signal YX of the output Y, and the clock signal CK2D. In the period in which the first integrator samples the signal, since the clock signal CK2D is "0", the voltage of the bottom plates of the capacitors C3PA and C3MB is set to the ground voltage (0 (V)), and the voltage of the bottom plates of the capacitors C3PB and C3MA is set to the reference voltage Vref.

Next, when the clock signal CK2D is shifted to the period of "1", and when the output Y is "1", the voltage of the bottom plate of the capacitor C3PA is changed from the ground voltage (0 (V)) to the reference voltage Vref, and the voltage of the bottom plate of the capacitor C3MA is changed from the reference voltage Vref to the ground voltage (0 (V)). Note that the voltage of the bottom plate of the capacitor C3PB is maintained at the reference voltage Vref, and the voltage of the bottom plate of the capacitor C3MB is maintained at the ground voltage (0 (V)). Therefore, as described above, the potential of the input node in the operational amplifier OPA1 is converged to the common mode potential VCM.

On the other hand, when the clock signal CK2D is shifted to the period of "1", and when the inverted signal YX is "1", the voltage of the bottom plate of the capacitor C3PB is changed from the reference voltage Vref to the ground voltage (0 (V)), and the voltage of the bottom plate of the capacitor C3MB is changed from the ground voltage (0 (V)) to the reference voltage Vref. Note that the voltage of the bottom plate of the capacitor C3PA is maintained at the ground voltage (0 (V)), and the voltage of the bottom plate of the capacitor C3MA is maintained at the reference voltage Vref. Therefore, as described above, the potential of the input node in the operational amplifier OPA1 is converged to the common mode potential VCM.

Similarly, the voltage of the bottom plates of the reference capacitors C5PA, C5PB, C5MA and C5MB in the second integrator is controlled by the output Y, the inverted signal YX of the output Y, and the clock signal CK1D. In the period in which the second integrator samples the signal, since the clock signal CK1D is "0", the voltage of the bottom plates of the capacitors C5PA and C5MB is set to the ground voltage (0 (V)), and the voltage of the bottom plates of the capacitors C5PB and C5MA is set to the reference voltage Vref.

Next, when the clock signal CK1D is shifted to the period of "1", and when the output Y is "1", the voltage of the bottom plate of the capacitor C5PA is changed from the ground voltage (0 (V)) to the reference voltage Vref, and the voltage of the bottom plate of the capacitor C5MA is changed from the reference voltage Vref to the ground voltage (0 (V)). Note that the voltage of the bottom plate of the capacitor C5PB is maintained at the reference voltage Vref, and the voltage of the bottom plate of the capacitor C5MB is maintained at the ground voltage (0 (V)). Therefore, as described above, the potential of the input node in the operational amplifier OPA2 is converged to the common mode potential VCM.

On the other hand, when the clock signal CK1D is shifted to the period of "1", and when the inverted signal YX is "1", the voltage of the bottom plate of the capacitor C5PB is changed from the reference voltage Vref to the ground voltage (0 (V)), and the voltage of the bottom plate of the capacitor C5MB is changed from the ground voltage (0 (V)) to the reference voltage Vref. Note that the voltage of the bottom plate of the capacitor C5PA is maintained at the ground voltage (0 (V)), and the voltage of the bottom plate of the capacitor C5MA is maintained at the reference voltage Vref. Therefore, as described above, the potential of the input node in the operational amplifier OPA2 is converged to the common mode potential VCM.

As described above, in the delta-sigma modulator illustrated in FIG. 4, the potential of the input node of the operational amplifiers OPA1 and OPA2 becomes the common mode potential VCM in the circuit regardless of the reference voltage Vref and the common mode potential VICM of the inputted differential analog signal. With the delta-sigma modulator illustrated in FIG. 4, it is possible to provide a delta-sigma A/D converter which enables a differential analog signal having any common mode potential to be inputted, and enables any reference voltage to be set.

FIG. 5 is a view illustrating a flow of operations of the delta-sigma modulator illustrated in FIG. 4.

In FIG. 5, reference characters CK1, CK1D, CK2 and CK2D respectively denote clock signals, reference characters SICA and SIOA respectively denote operation and output of the first integrator, and reference characters SICB and SIOB respectively denote operation and output of the second integrator. Reference character CMPO denotes an output of the comparator, and reference character DFFO denotes an output of the D flip-flop. Reference character FBB denotes a feedback signal to the second integrator, and reference character FBA denotes a feedback signal to the first integrator. As described above, in the delta-sigma modulator illustrated in FIG. 4, during the period in which the clock signal CK1 (CK1D) is "1", the first integrator samples the signal, and the second integrator performs addition and integration of the signal. Further, during the period in which the clock signal CK2 (CK2D) is "1", the first integrator performs addition and integration of the signal, and the second integrator samples the signal.

First, at time T1, the first integrator samples a first signal (S1). At subsequent time T2, the first integrator performs addition and integration (I1) of the first signal. Further, simultaneously with the addition and integration (I1) by the first integrator, the second integrator samples a first signal (the output of the first integrator) (S1). At subsequent time T3, the first integrator samples a second signal (S2), and the second integrator performs addition and integration (I1) of the first signal.

At subsequent time T4, the first integrator performs addition and integration (I2) of the second signal. Further, simultaneously with the addition and integration (I2) by the first integrator, the second integrator samples a second signal (S2). At this time, immediately before the time T4, the comparator CMP determines the sign (positive/negative) of the output signal SIOB of the second integrator. In this case, the D flip-flop FF is set to the through state, and the output DFFO of the D flip-flop FF is updated by the output CMPO of the comparator CMP. By the updated output DFFO of the D flip-flop FF, the feedback value FBB is supplied to the second integrator which is shifted to perform the sampling (S2) of the signal. In this way, the output value is fed back to the second integrator after one cycle.

At subsequent time T5, the first integrator samples a third signal (S3), and the second integrator performs addition and integration (I2) of the second signal. In the sampling of the signal, which is performed by the first integrator, the feedback value FBA is supplied to the first integrator by the previously updated output DFFO of the D flip-flop FF. In this way, the output value is fed back to the first integrator after two cycles. The above operations are subsequently repeated at times T6, T7, . . . , and thereby the A/D conversion of the inputted differential analog signal is performed.

Note that, in the above description, a 1-bit second-order delta-sigma modulator is described as an example, but the embodiment is not limited to this. The embodiment can also be applied to a delta-sigma A/D converter provided with a delta-sigma modulator having a different bit width and a different transfer function.

When the signal corresponding to the output of the modulator is added or subtracted to or from the input signal in the arithmetic operation circuit, the connection of the third capacitor and the fourth capacitor, and the connection of the fifth capacitor and the sixth capacitor are complementarily switched, so that the amount of charge added to the input node of the arithmetic operator becomes the same even when the reference voltage is set to any voltage. Therefore, since the potential of the input node of the arithmetic operator is converged to the common mode potential of the circuit, a differential analog signal of any common mode potential can be inputted, and any reference voltage can be set.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An A/D converter comprising:
    a modulator configured to perform delta-sigma modulation of a differential analog signal; and
    a decimation filter configured to generate digital data on the basis of an output of the modulator,
    wherein the modulator comprises at least one arithmetic operation circuit configured to alternately repeat a sampling state and an arithmetic operation state including:
        a first capacitor and a second capacitor each of which samples an input signal;
        a third capacitor and a fourth capacitor each of which has a first electrode connected to a first electrode of the first capacitor and configured to perform sampling of a first reference voltage or a second reference voltage different from the first reference voltage;
        a fifth capacitor and a sixth capacitor each of which has a first electrode connected to a first electrode of the second capacitor and configured to perform sampling of the first reference voltage or the second reference voltage; and
        the arithmetic operator configured to obtain a first addition or subtraction result by performing addition or subtraction between charge sampled by the first capacitor and charge sampled by the third capacitor and the fourth capacitor, and configured to obtain a second addition or subtraction result by performing addition or subtraction between charge sampled by the second capacitor and charge sampled by the fifth capacitor and the sixth capacitor, and thereby integrates the first addition or subtraction result to output a first integration result, and integrates the second addition or subtraction result to output a second integration result,
    wherein in an addition state of the arithmetic operation state, a second electrode of each of the third capacitor and the fourth capacitor is connected to the first reference voltage, and a second electrode of each of the fifth capacitor and the sixth capacitor is connected to the second reference voltage,
    wherein in a subtraction state of the arithmetic operation state, the second electrode of each of the third capacitor and the fourth capacitor is connected to the second reference voltage, and the second electrode of each of the fifth capacitor and the sixth capacitor is connected to the first reference voltage, and
    wherein in the sampling state, the second electrode of each of the third capacitor and the sixth capacitor is connected to the first reference voltage, and the second electrode of each of the fourth capacitor and the fifth capacitor is connected to the second reference voltage.

2. The A/D converter according to claim 1 that alternately repeats
    a first state in which the second electrode of one of the third capacitor and the fourth capacitor is connected to the first reference voltage, the second electrode of the other of the third capacitor and the fourth capacitor is connected to the second reference voltage, the second electrode of one of the fifth capacitor and the sixth capacitor is connected to the first reference voltage, and the second electrode of the other of the fifth capacitor and the sixth capacitor is connected to the second reference voltage, and
    a second state in which, according to a feedback signal based on the output of the modulator, the second electrode of each of the third capacitor and the fourth capacitor is connected to the first reference voltage, and also the second electrode of each of the fifth capacitor and the sixth capacitor is connected to the second reference voltage, or the second electrode of each of the third capacitor and the fourth capacitor is connected to the second reference voltage, and also the second electrode of each of the fifth capacitor and the sixth capacitor is connected to the first reference voltage.

3. The A/D converter according to claim 2, wherein the modulator includes a plurality of the arithmetic operation circuits; and
    when one of the plurality of the arithmetic operation circuits arranged in series is set in the first state, the other arithmetic operation circuits is set in the second state.

4. An arithmetic operator of a delta-sigma type A/D converter comprising,
    a fully differential operational amplifier including a negative side input node which is connected, via a first switch, to a first electrode of each of a first capacitor, a third capacitor, and a fourth capacitor, and a positive side input node which is connected, via a second switch, to a first electrode of each of the second capacitor, a fifth capacitor, and a sixth capacitor;
    a seventh capacitor which is connected between the negative side input node and a positive side output node of the fully differential operational amplifier;

an eighth capacitor which is connected between the positive side input node and a negative side output node of the fully differential operational amplifier;
a common mode voltage node independent of a reference voltage, from a plurality of references, and the common mode potential of the inputted differential signal is connected with a first switch to the first electrode of the first capacitor, the third capacitor, and the fourth capacitor;
connected with a second switch to the first electrode of the second capacitor, the fifth capacitor, and the sixth capacitor; coupled with a third switch to a second electrode of the first capacitor; and
coupled with a fourth switch to a second electrode of the second capacitor, and
an arithmetic operation circuit configured to alternately repeat a sampling state and an arithmetic operation state,
wherein in the sampling state, a second electrode of each of the third capacitor and the sixth capacitor is connected to a first reference voltage, and a second, electrode of each of the fourth capacitor and the fifth capacitor is connected to a second reference voltage,
wherein in a case where addition is performed in the arithmetic operation state, the second electrode of each of the third capacitor and the fourth capacitor is connected to the first reference voltage, and the second electrode of each of the fifth capacitor and the sixth capacitor is connected to the second reference voltage; and
wherein in a case where subtraction is performed in the arithmetic operation state, the second electrode of each of the third capacitor and the fourth capacitor is connected to the second reference voltage, and the second electrode of each of the fifth capacitor and the sixth capacitor is connected to the first reference voltage.

5. An arithmetic operator of a delta-sigma type A/D converter comprising,
a modulator configured to perform delta-sigma modulation of a differential analog signal; and
a decimation filter configured to generate digital data on basis of an output of the modulator,
wherein the modulator comprises at least one arithmetic operation circuit that alternately repeats a sampling state and an arithmetic operation state including:
a first capacitor and a second capacitor each of which samples an input signal;
a third capacitor and a fourth capacitor each of which has a first electrode connected to a first electrode of the first capacitor and, configured to perform sampling of a first reference voltage or a second reference voltage different from the first reference voltage; and
a fifth capacitor and a sixth capacitor each of which has a first electrode connected to a first electrode of the second capacitor and configured to perform sampling of the first reference voltage or the second reference voltage;
a fully differential operational amplifier including a negative side input node which is connected to the first electrode of each of the first capacitor, the third capacitor, and the fourth capacitor, and a positive side input node which is connected to the first electrode of each of the second capacitor, the fifth capacitor, and the sixth capacitor;
a first switch and a seventh capacitor which are connected in series between the negative side input node and a positive side output node of the fully differential operational amplifier;

a second switch which is connected between the negative side input node and the positive side output node of the fully differential operational amplifier;
a third switch and an eighth capacitor which are connected in series between the positive side input node and a negative side output node of the fully differential operational amplifier; and
a fourth switch which is connected between the positive side input node and the negative side output node of the fully differential operational amplifier.

6. An arithmetic operator of a delta-sigma type A/D converter comprising,
a modulator configured to performs delta-sigma modulation of a differential analog signal; and
a decimation filter configured to generate digital data on basis of an output of the modulator,
wherein the modulator comprises at least one arithmetic operation circuit that alternately repeats a sampling state and an arithmetic operation state including:
a first capacitor and a second capacitor each of which are configured to sample an input signal;
a third capacitor and a fourth capacitor each of which has a first electrode connected to a first electrode of the first capacitor and configured to perform sampling of a first reference voltage or a second reference voltage different from the first reference voltage; and
a fifth capacitor and a sixth capacitor each of which has a first electrode connected to a first electrode of the second capacitor and configured to perform sampling of the first reference voltage or the second reference voltage;
a fully differential operational amplifier including a negative side input node which is connected to the first electrode of each of the first capacitor, the third capacitor, and the fourth capacitor, and a positive side input node which is connected to the the electrode of each of the second capacitor, the fifth capacitor, and the sixth capacitor;
a third switch and a ninth capacitor which are connected in series between the negative side input node and a positive side output node of the fully differential operational amplifier;
a fourth switch which is connected between the negative side input node and the positive side output node of the fully differential operational amplifier;
a fifth switch and a tenth capacitor which are connected in series between the positive side input node and a negative side output node of the fully differential operational amplifier; and
a sixth switch which is connected between the positive side input node and the negative side output node of the fully differential operational amplifier.

7. An arithmetic operator of a delta-sigma type A/D converter comprising a plurality of arithmetic operation circuits, the arithmetic operator of the plurality of the arithmetic operation circuits of a first stage includes:
a modulator configured to performs delta sigma modulation of a differential analog signal; and
a decimation filter configured to generate digital data on basis of an output of the modulator,
wherein the modulator comprises at least one arithmetic operation circuit that alternately repeats a sampling state and an arithmetic operation state including:
a first capacitor and a second capacitor each of which samples an input signal;
a third capacitor and a fourth capacitor each of which has a first electrode connected to a first electrode of the first capacitor and configured to perform sampling of
a first reference voltage or a second reference voltage
different from the first reference voltage;
a fifth capacitor and a sixth capacitor each of which has
a first electrode connected to a first electrode of the
second capacitor and configured to perform sampling
of the first reference voltage or the second reference
voltage;
a fully differential operational amplifier including a negative side input node which is connected to the first electrode of each of the first capacitor, the third capacitor, and the fourth capacitor, and a positive side input node which is connected to the first electrode of each of the second capacitor, the fifth capacitor, and the sixth capacitor;
a first switch and a seventh capacitor which are connected in series between the negative side input node and a positive side output node of the fully differential operational amplifier;
a second switch which is connected between the negative side input node and the positive side output node of the fully differential operational amplifier;
a third switch and an eighth capacitor which are connected in series between the positive side input node and a negative side output node of the fully differential operational amplifier; and
a fourth switch which is connected between the positive side input node and the negative side output node of the fully differential operational amplifier, and the arithmetic operator of the arithmetic operation circuit of each of stages subsequent to the first stage includes:
a fully differential operational amplifier comprising a negative side input node which is connected, via a fifth switch, to the first electrode of each of the first capacitor, the third capacitor, and the fourth capacitor, and a positive side input node which is connected, via a sixth switch, to the first electrode of each of the second capacitor, the fifth capacitor, and the sixth capacitor;
a ninth capacitor which is connected between the negative side input node and a positive side output node of the fully differential operational amplifier; and
a tenth capacitor which is connected between the positive side input node and a negative side output node of the fully differential operational amplifier.

8. The A/D converter according to claim 1,
wherein the first reference voltage is a ground voltage, and the second reference voltage is a voltage to be referred to.

9. The A/D converter according to claim 4, wherein:
the first capacitor and the second capacitor each of which samples an input signal;
the first electrode of the third and the forth capacitor connected to the first electrode of the first capacitor and performs sampling of the first reference voltage or the second reference voltage different from the first reference voltage;
the first electrode of the fifth and the sixth capacitor connected to the first electrode of the second capacitor and performs sampling of the first reference voltage or the second reference voltage; and
the arithmetic operator configured to obtain a first addition or subtraction result by performing addition or subtraction between charge sampled by the first capacitor and charge sampled by the third capacitor and the fourth capacitor, and configured to obtain a second addition or subtraction result by performing addition or subtraction between charge sampled by the second capacitor and charge sampled by the fifth capacitor and the sixth capacitor, and thereby integrates the first addition or subtraction result to output a first integration result, and integrates the second addition or subtraction result to output a second integration result.

10. The A/D converter according to claim 4 that alternately repeats
a first state in which the second electrode of one of the third capacitor and the fourth capacitor is connected to the first reference voltage, the second electrode of the other of the third capacitor and the fourth capacitor is connected to the second reference voltage, the second electrode of one of the fifth capacitor and the sixth capacitor is connected to the first reference voltage, and the second electrode of the other of the fifth capacitor and the sixth capacitor is connected to the second reference voltage, and
a second state in which, according to a feedback signal based on the output of the modulator, the second electrode of each of the third capacitor and the fourth capacitor is connected to the first reference voltage, and also the second electrode of each of the fifth capacitor and the sixth capacitor is connected to the second reference voltage, or the second electrode of each of the third capacitor and the fourth capacitor is connected to the second reference voltage, and also the second electrode of each of the fifth capacitor and the sixth capacitor is connected to the first reference voltage.

11. The A/D converter according to claim 10, wherein the modulator includes a plurality of the arithmetic operation circuits; and
when one of the plurality of the arithmetic operation circuits arranged in series is set in the first state, the other arithmetic operation circuits is set in the second state.

12. The A/D converter according to claim 4, further comprising the first reference voltage and the second reference voltage, wherein the first reference voltage is a ground voltage and the second reference voltage is a voltage to be referred to.

13. The A/D converter according to claim 5, wherein:
the first capacitor and the second capacitor each of which samples an input signal;
the first electrode of the third and the fourth capacitor connected to the first electrode of the first capacitor and performs sampling of the first reference voltage or the second reference voltage different from the first reference voltage;
the first electrode of the fifth and the sixth capacitor connected to the first electrode of the second capacitor and performs sampling of the first reference voltage or the second reference voltage; and
the arithmetic operator configured to obtain a first addition or subtraction result by performing addition or subtraction between charge sampled by the first capacitor and charge sampled by the third capacitor and the fourth capacitor, and configured to obtain a second addition or subtraction result by performing addition or subtraction between charge sampled by the second capacitor and charge sampled by the fifth capacitor and the sixth capacitor, and thereby integrates the first addition or subtraction result to output a first integration result, and integrates the second addition or subtraction result to output a second integration result.

14. The A/D converter according to claim 5 that alternately repeats
a first state in which a second electrode of one of the third capacitor and the fourth capacitor is connected to the first reference voltage, the second electrode of the other of the third capacitor and the fourth capacitor is connected to the second reference voltage, a second electrode of one of the fifth capacitor and the sixth capacitor is connected to the first reference voltage, and the second electrode of the other of the fifth capacitor and the sixth capacitor is connected to the second reference voltage, and a second state in which, according to a feedback signal based on the output of the modulator, the second electrode of each of the third capacitor and the fourth capacitor is connected to the first reference voltage, and also the second electrode of each of the fifth capacitor and the sixth capacitor is connected to the second reference voltage, or the second electrode of each of the third capacitor and the fourth capacitor is connected to the second reference voltage, and also the second electrode of each of the fifth capacitor and the sixth capacitor is connected to the first reference voltage.

15. The A/D converter according to claim 14, wherein the modulator includes a plurality of the arithmetic operation circuits; and when one of the plurality of the arithmetic operation circuits arranged in series is set in the first state, the other arithmetic operation circuits is set in the second state.

16. The A/D converter according to claim 5, wherein:

the arithmetic operation circuit alternately repeats a sampling state and an arithmetic operation state;

in the sampling state, a second electrode of each of the third capacitor and the sixth capacitor is connected to the first reference voltage, and a second electrode of each of the fourth capacitor and the fifth capacitor is connected to the second reference voltage;

in the case where addition is performed in the arithmetic operation state, the second electrode of each of the third capacitor and the fourth capacitor is connected to the first reference voltage, and the second electrode of each of the fifth capacitor and the sixth capacitor is connected to the second reference voltage; and in the case where subtraction is performed in the arithmetic operation state, the second electrode of each of the third capacitor and the fourth capacitor is connected to the second reference voltage, and the second electrode of each of the fifth capacitor and the sixth capacitor is connected to the first reference voltage.

17. The A/D converter according to claim 5, further comprising the first reference voltage and the second reference voltage, wherein the first reference voltage is a ground voltage and the second reference voltage is a voltage to be referred to.

18. The A/D converter according to claim 6, wherein:

the first capacitor and the second capacitor each of which samples an input signal;

the first electrode of the third and the fourth capacitor connected to the first electrode of the first capacitor and performs sampling of the first reference voltage or the second reference voltage different from the first reference voltage;

the first electrode of the fifth and the sixth capacitor connected to the first electrode of the second capacitor and performs sampling of the first reference voltage or the second reference voltage; and the arithmetic operator configured to obtain a first addition or subtraction result by performing addition or subtraction between charge sampled by the first capacitor and charge sampled by the third capacitor and the fourth capacitor, and configured to obtain a second addition or subtraction result by performing addition or subtraction between charge sampled by the second capacitor and charge sampled by the fifth capacitor and the sixth capacitor, and thereby integrates the first addition or subtraction result to output a first integration result, and integrates the second addition or subtraction result to output a second integration result.

19. The A/D converter according to claim 6 that alternately repeats a first state in which a second electrode of one of the third capacitor and the fourth capacitor is connected to the first reference voltage, the second electrode of the other of the third capacitor and the fourth capacitor is connected to the second reference voltage, a second electrode of one of the fifth capacitor and the sixth capacitor is connected to the first reference voltage, and the second electrode of the other of the fifth capacitor and the sixth capacitor is connected to the second reference voltage, and a second state in which, according to a feedback signal based on the output of the modulator, the second electrode of each of the third capacitor and the fourth capacitor is connected to the first reference voltage, and also the second electrode of each of the fifth capacitor and the sixth capacitor is connected to the second reference voltage, or the second electrode of each of the third capacitor and the fourth capacitor is connected to the second reference voltage, and also the second electrode of each of the fifth capacitor and the sixth capacitor is connected to the first reference voltage.

20. The A/D converter according to claim 19, wherein the modulator includes a plurality of the arithmetic operation circuits; and when one of the plurality of the arithmetic operation circuits arranged in series is set in the first state, the other arithmetic operation circuits is set in the second state.

21. The A/D converter according to claim 6, wherein:

the arithmetic operation circuit alternately repeats a sampling state and an arithmetic operation state;

in the sampling state, a second electrode of each of the third capacitor and the sixth capacitor is connected to the first reference voltage, and a second electrode of each of the fourth capacitor and the fifth capacitor is connected to the second reference voltage;

in the case where addition is performed in the arithmetic operation state, the second electrode of each of the third capacitor and the fourth capacitor is connected to the first reference voltage, and the second electrode of each of the fifth capacitor and the sixth capacitor is connected to the second reference voltage; and in the case where subtraction is performed in the arithmetic operation state, the second electrode of each of the third capacitor and the fourth capacitor is connected to the second reference voltage, and the second electrode of each of the fifth capacitor and the sixth capacitor is connected to the first reference voltage.

22. The A/D converter according to claim 6, further comprising the first reference voltage and the second reference voltage, wherein the first reference voltage is a ground voltage and the second reference voltage is a voltage to be referred to.

23. The A/D converter according to claim 7, wherein:

the first capacitor and the second capacitor each of which samples an input signal;

the first electrode of the third and the fourth capacitor connected to the first electrode of the first capacitor and performs sampling of the first reference voltage or the second reference voltage different from the first reference voltage;

the first electrode of the fifth and the sixth capacitor connected to the first electrode of the second capacitor and performs sampling of the first reference voltage or the second reference voltage; and the arithmetic operator which configured to obtain a first addition or subtraction result by performing addition or subtraction between charge sampled by the first capacitor and charge sampled by the third capacitor and the fourth capacitor, and configured to obtain a second addition or subtraction result by performing addition or subtraction between charge sampled by the second capacitor and charge sampled by the fifth capacitor and the sixth capacitor, and thereby integrates the first addition or subtraction result to output a first integration result, and integrates the second addition or subtraction result to output a second integration result.

24. The A/D converter according to claim 7 that alternately repeats a first state in which a second electrode of one of the third capacitor and the fourth capacitor is connected to the first reference voltage, the second electrode of the other of the third capacitor and the fourth capacitor is connected to the second reference voltage, a second electrode of one of the fifth capacitor and the sixth capacitor is connected to the first reference voltage, and the second electrode of the other of the fifth capacitor and the sixth capacitor is connected to the second reference voltage, and a second state in which, according to a feedback signal based on the output of the modulator, the second electrode of each of the third capacitor and the fourth capacitor is connected to the first reference voltage, and also the second electrode of each of the fifth capacitor and the sixth capacitor is connected to the second reference voltage, or the second electrode of each of the third capacitor and the fourth capacitor is connected to the second reference voltage, and also the second electrode of each of the fifth capacitor and the sixth capacitor is connected to the first reference voltage.

25. The A/D converter according to claim 24, wherein the modulator includes the plurality of the arithmetic operation circuits; and when one of the plurality of the arithmetic operation circuits arranged in series is set in the first state, the other arithmetic operation circuits is set in the second state.

26. The A/D converter according to claim 7, wherein:

the arithmetic operation circuit alternately repeats a sampling state and an arithmetic operation state;

in the sampling state, a second electrode of each of the third capacitor and the sixth capacitor is connected to the first reference voltage, and a second electrode of each of the fourth capacitor and the fifth capacitor is connected to the second reference voltage;

in the case where addition is performed in the arithmetic operation state, the second electrode of each of the third capacitor and the fourth capacitor is connected to the first reference voltage, and the second electrode of each of the fifth capacitor and the sixth capacitor is connected to the second reference voltage; and in the case where subtraction is performed in the arithmetic operation state, the second electrode of each of the third capacitor and the fourth capacitor is connected to the second reference voltage, and the second electrode of each of the fifth capacitor and the sixth capacitor is connected to the first reference voltage.

27. The A/D converter according to claim 7, further comprising the first reference voltage and the second reference voltage, wherein the first reference voltage is a ground voltage and the second reference voltage is a voltage to be referred to.

* * * * *

UNITED STATES PATENT AND TRADEMARK OFFICE
CERTIFICATE OF CORRECTION

PATENT NO.      : 8,830,097 B2  
APPLICATION NO. : 13/558093  
DATED           : September 9, 2014  
INVENTOR(S)     : Aruga et al.

Page 1 of 1

It is certified that error appears in the above-identified patent and that said Letters Patent is hereby corrected as shown below:

In the Claims:

Claim 6, column 26, line 36, "connected to the the" should read -- connected to the --; and Claim 7, column 26, line 57, "configured to performs" should read -- configured to perform --.

Signed and Sealed this  
Twenty-third Day of December, 2014

Michelle K. Lee  
*Deputy Director of the United States Patent and Trademark Office*